US012751133B2

(12) United States Patent
Xie et al.

(10) Patent No.: US 12,751,133 B2
(45) Date of Patent: Sep. 29, 2026

(54) ORGANIC ELECTROLUMINESCENT DEVICE

(71) Applicant: BEIJING SUMMER SPROUT TECHNOLOGY CO., LTD., Beijing (CN)

(72) Inventors: Menglan Xie, Beijing (CN); Huiqing Pang, Beijing (CN); Chi Yuen Raymond Kwong, Beijing (CN); Jing Wang, Beijing (CN)

(73) Assignee: BEIJING SUMMER SPROUT TECHNOLOGY CO., LTD., Beijing (CN)

( * ) Notice: Subject to any disclaimer, the term of this patent is extended or adjusted under 35 U.S.C. 154(b) by 438 days.

(21) Appl. No.: 18/233,141

(22) Filed: Aug. 11, 2023

(65) Prior Publication Data

US 2024/0074221 A1 Feb. 29, 2024

(30) Foreign Application Priority Data

Aug. 12, 2022 (CN) ......................... 202210964694.5

(51) Int. Cl.
*H10K 50/11* (2023.01)
*H10K 50/155* (2023.01)
(Continued)

(52) U.S. Cl.
CPC ........... *H10K 50/11* (2023.02); *H10K 50/155* (2023.02); *H10K 2101/30* (2023.02); *H10K 2102/351* (2023.02)

(58) Field of Classification Search
None
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 100373656 C 3/2008
CN 105359293 A 2/2016
(Continued)

OTHER PUBLICATIONS

Tang, et al., "Organic electroluminescent diodes," Appl. Phys. Lett., 51, 913 (1987); doi: 10.1063/1.98799.
(Continued)

*Primary Examiner* — Anthony Ho
(74) *Attorney, Agent, or Firm* — KDW FIRM PLLC

(57) ABSTRACT

Provided is an organic electroluminescent device. The organic electroluminescent device includes an anode, a cathode, and a hole transporting region disposed between the anode and the cathode; the hole transporting region includes a first organic layer; the first organic layer contains a first p-type dopant and a second p-type dopant; the first p-type dopant is different from the second p-type dopant. The electroluminescent device containing at least two different p-type dopants in the first organic layer in the hole transporting region can maintain a high external quantum efficiency and achieve the great reduction in voltages and the significant improvement in lifetimes, thereby improving the comprehensive performance of the device. Further provided is an electronic assembly containing the organic electroluminescent device.

18 Claims, 2 Drawing Sheets

(51) Int. Cl.

| | |
|---|---|
| *H10K 101/30* | (2023.01) |
| *H10K 102/00* | (2023.01) |

(56) References Cited

U.S. PATENT DOCUMENTS

| | | | |
|---|---|---|---|
| 5,844,363 A | 12/1998 | Gu et al. | |
| 6,097,147 A | 8/2000 | Baldo et al. | |
| 6,303,238 B1 | 10/2001 | Thompson et al. | |
| 7,279,704 B2 | 10/2007 | Walters et al. | |
| 7,968,146 B2 | 6/2011 | Wagner et al. | |
| 2003/0230980 A1 | 12/2003 | Forrest et al. | |
| 2004/0174116 A1 | 9/2004 | Lu et al. | |
| 2014/0203251 A1 | 7/2014 | Jung et al. | |
| 2015/0349273 A1 | 12/2015 | Hung et al. | |
| 2016/0359122 A1 | 12/2016 | Boudreault et al. | |
| 2017/0125701 A1* | 5/2017 | Pfister ................ | H10K 85/6572 |
| 2018/0219156 A1* | 8/2018 | Mujica-Fernaud ... | C07C 209/68 |
| 2020/0111960 A1 | 4/2020 | Li et al. | |
| 2021/0408380 A1 | 12/2021 | Hur et al. | |
| 2022/0246855 A1 | 8/2022 | Kim et al. | |

FOREIGN PATENT DOCUMENTS

| | | | |
|---|---|---|---|
| CN | 107112437 | A | 8/2017 |
| CN | 107924999 | A | 4/2018 |
| CN | 108431980 | A | 8/2018 |
| CN | 110462865 | A | 11/2019 |
| CN | 112194670 | A | 1/2021 |
| EP | 3451402 | A1 | 3/2019 |
| JP | 2015-092560 | A | 5/2015 |
| JP | 2016-529695 | A | 9/2016 |
| JP | 2017-199866 | A | 11/2017 |
| JP | 2018-536289 | A | 12/2018 |
| JP | 2020-508572 | A | 3/2020 |
| JP | 2022-020601 | A | 2/2022 |
| KR | 10-2013-0025799 | A | 3/2013 |
| KR | 10-2016-0035561 | A | 3/2016 |
| KR | 10-2018-0009522 | A | 1/2018 |
| KR | 10-2021-0155441 | A | 12/2021 |
| WO | 2022/092046 | A1 | 5/2022 |

OTHER PUBLICATIONS

Chinese First Office Action in CN Application No. 2022109646945.5 dated May 28, 2026, 10 pages.

* cited by examiner

ORGANIC ELECTROLUMINESCENT DEVICE

CROSS-REFERENCE TO RELATED APPLICATION(S)

This application claims priority to Chinese Patent Application No. 202210964694.5 filed on Aug. 12, 2022, the disclosure of which is incorporated herein by reference in its entirety.

TECHNICAL FIELD

The present disclosure relates to an organic electroluminescence device and specifically, to an organic electroluminescent device containing a specific first organic layer.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

An organic electroluminescent device (such as an OLED) is composed of a cathode, an anode, and a series of organic light-emitting materials stacked between the cathode and the anode, can convert electrical energy into light by applying a voltage at both the cathode and the anode of the device, and has the advantages of a wide angle, a high contrast ratio, and fast response time. In 1987, Tang and Van Slyke of Eastman Kodak reported an organic electroluminescent device, which includes an arylamine hole transporting layer and a tris-8-hydroxyquinolato-aluminum layer as an electron transporting layer and an emissive layer (*Applied Physics Letters,* 1987, 51 (12): 913-915). Once a voltage is applied across the device, green light is emitted from the device. This device laid a foundation for the development of modern organic light-emitting diodes (OLEDs). Since the OLED is a self-emitting solid-state device, it offers tremendous potential for display and illumination applications. In addition, the inherent properties of organic materials, such as their flexibility, may make them well suited for particular applications such as fabrication on flexible substrates for flexible display or illumination. The OLED has the advantages of low cost, low power consumption, high brightness, a wide viewing angle, a small thickness, etc., and has been widely applied in the fields of display and illumination after decades of development.

The OLED device is generally composed of multiple stacked organic functional layers and further includes a hole transporting region and an electron transporting region in addition to a cathode, an anode, and an emissive layer (EML). The hole transporting region is located between the anode and the emissive layer and generally includes functional layers such as a hole injection layer (HIL), a hole transporting layer (HTL), and an electron blocking layer (EBL). The electron transporting region is located between the cathode and the emissive layer and generally includes functional layers such as a hole blocking layer (HBL), an electron transporting layer (ETL), and an electron injection layer (EIL). One or more of these functional layers may be selected as required to set or may not be present. For example, the EBL and/or the HBL may be selected as required to be present or absent. The hole injection layer and the electron injection layer inject holes and electrons from the anode terminal and the cathode terminal into the device, respectively. The two kinds of carriers migrate to the emissive layer through the transporting layers and recombine in the emissive layer to form excitons. The excitons radiate when the excitons drop from an excited state to a ground state, thereby achieving light emission. The electron blocking layer and the hole blocking layer are generally optional layers. The hole injection layer can be a functional layer containing a single material or a functional layer containing a variety of materials, and the most commonly used one among the variety of materials is a hole transporting material (HTM) doped with a certain proportion of a p-type dopant (PD). Through the strong electron trapping capability of the p-type dopant, electrons are trapped from the hole transporting material to the p-type doped material, and the concentration of holes in the hole transporting matrix is greatly improved so that the energy level matching of the anode with the organic layers forms good hole injection and transporting.

The effective recombination of electrons and holes is an important factor affecting the quantum efficiency of light emission of the device. At present, the carrier balance of the OLED device is mainly improved by the following three methods: the first is to use appropriate electron and hole injection materials to balance the concentration of carriers, the second is to improve electron and hole transporting materials to change the capabilities of organic transporting materials to transporting carriers to achieve the balance, and the third is to adjust the transporting performance of host materials and/or light-emitting materials in the emissive layer to achieve the carrier balance. The hole transporting materials (HTMs) in the existing OLED device are mostly aromatic amine compounds which have relatively strong electron-donating capabilities, thereby achieving good hole conduction. Assuming that electrons and holes injected from the cathode and the anode respectively have the same concentration, due to differences in the performance of organic materials themselves, a hole mobility in the OLED structure is 1-3 orders of magnitude higher than an electron mobility, that is, the concentration of holes transported to the emissive layer is much greater than that of electrons transported to the emissive layer, resulting in an unbalanced carrier concentration and forming a hole-rich device. The carrier imbalance easily causes carriers to accumulate at an interface between film layers and generate heat, accelerating the aging of the device and causing a reduction in lifetimes, and the carrier imbalance also reduces the recombination probability of excitons, resulting in a decrease in device efficiency. Although carriers can be balanced by improving electron injection and transporting performance, organic materials that can be selected are relatively few. Therefore, effectively reducing the number of holes reaching the light-emitting region is an effective way to improve the carrier balance and enhance the device performance.

The hole injection capability of the HIL in the OLED is regulated generally by doping the HTM with an appropriate amount of a p-type dopant so that the anode is in ohmic contact with the HIL, achieving a good hole injection effect. At present, the HTM doped with a single p-type dopant is generally used in the commercial structure, but in fact, the regulation of the single p-type dopant on hole injection is very limited. When the concentration of the p-type doped material is low, the ohmic contact cannot be formed, affecting the voltage and lifetime of the device. When the concentration of the p-type doped material is high, although the formation of the ohmic contact is guaranteed, the concentration of holes in the emissive layer is further higher than the concentration of electrons due to a large number of holes injected, resulting in carrier imbalance and intensifying the transverse crosstalk effect between different pixels.

In the conventional technology, the thickness of the hole transporting layer is generally increased to balance the electrons and holes in the OLED so that electrons and holes can effectively recombine in the organic layers at the same time without causing hole accumulation. However, the increase in the thickness of the hole transporting layer brings negative effects such as voltage increase, efficiency decrease and even lifetime reduction.

The use of a multi-layer HIL to regulate the hole injection is also disclosed in the related art. For example, Patent CN100373656C discloses an organic luminous display element. In this patent, the hole injection layer cooperates with the first transporting layer, the hole injection layer uses a fluorinated carbon compound, and the first hole transporting layer uses a p-type dopant, so as to achieve the effect of reducing the voltage. However, the device disclosed in this patent only contains one p-type doped organic layer as a hole transporting layer rather than a hole injection layer, does not disclose an organic electroluminescent device that contains multiple different p-type dopants in the same organic layer, and does not disclose or teach the influence of such multiple different p-type dopants in the same organic layer on the device performance.

Patent application CN107112437A discloses a device structure that contains two p-type doped materials in its embodiments, but only one type of p-type dopant is used in each layer. The patent does not disclose or teach the influence on the device performance when the same organic layer contains different p-type dopants.

In conclusion, some solutions are disclosed in the related art to regulate the hole injection capability of the HIL. For example, a multi-layer HIL that contains only one p-type doped material is used. However, when a single p-type dopant material is used in the device, the hole injection capability can be adjusted only by adjusting the doping proportion of the p-type dopant, and when the doping proportion of the p-type dopant is such that the p-type dopant reaches a certain concentration, the hole injection cannot be further regulated so the capability of the single p-type dopant (PD) to regulate hole injection is limited. Therefore, how to develop a new organic electroluminescent device to achieve more effective regulation on hole injection and transporting to obtain a lower voltage, a longer lifetime and comprehensive improvement of the device efficiency is a problem to be solved urgently by the persons skilled in the art.

SUMMARY

The present disclosure aims to provide a new organic electroluminescent device to solve at least part of the above problems. The organic electroluminescent device disclosed by the present disclosure includes an anode, a cathode, and a hole transporting region disposed between the anode and the cathode; the hole transporting region contains a first organic layer; the first organic layer contains a first p-type dopant and a second p-type dopant; the first p-type dopant is different from the second p-type dopant. The organic electroluminescent device disclosed by the present disclosure provides more space for adjusting the hole injection and transporting capability in a device by introducing at least two different p-type dopants into the first organic layer in the hole transporting region and can better balance carriers in the device, thereby obtaining more excellent comprehensive performance of the device and achieving the great reduction in voltages and the significant improvement in lifetimes while maintaining a high external quantum efficiency.

According to an embodiment of the present disclosure, an organic electroluminescent device is disclosed. The organic electroluminescent device includes an anode, a cathode, and a hole transporting region disposed between the anode and the cathode;

- wherein the hole transporting region contains a first organic layer;
- the first organic layer contains a first p-type dopant and a second p-type dopant; and
- the first p-type dopant is different from the second p-type dopant.

According to another embodiment of the present disclosure, an electronic assembly is further disclosed. The electronic assembly includes the organic electroluminescent device described in the preceding embodiment.

The organic electroluminescent device disclosed by the present disclosure provides more space for adjusting the hole injection and transporting capability in the device by introducing at least two different p-type dopants into the first organic layer in the hole transporting region. For example, in one aspect, the regulation of the hole injection capability may be achieved by selecting different PD materials (PD materials having different LUMO energy levels and/or different structures), and in another aspect, the regulation of the hole injection capability may also be achieved by simultaneously regulating the doping proportions of two PD materials. The preceding adjustment manners balance carriers in the device and greatly improve the comprehensive performance of the device, which cannot be achieved when the HIL layer contains only one PD material. The electroluminescent device containing at least two different p-type dopants in the first organic layer in the hole transporting region disclosed by the present disclosure can maintain a high external quantum efficiency and achieve the great reduction in voltages and the significant improvement in lifetimes, thereby improving the comprehensive performance of the device.

DETAILED DESCRIPTION

Figure 1:
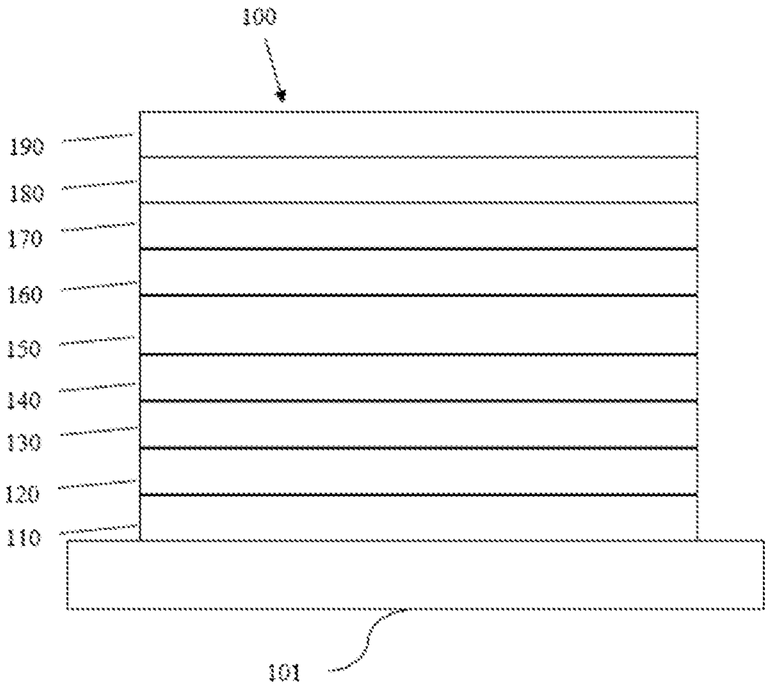
FIG. 1 is a structure diagram of an organic electroluminescent device 100 according to the present disclosure.

The OLED can be fabricated on various substrates such as glass, plastic, and metal. FIG. 1 schematically shows an organic light-emitting device 100 without limitation. The figures are not necessarily drawn to scale. Some of the layers in the figures can also be omitted as required. The device 100 may include a substrate 101, an anode 110, a hole injection layer 120, a hole transporting layer 130, an electron blocking layer 140 (optional), an emissive layer 150, a hole blocking layer 160 (optional), an electron transporting layer 170, an electron injection layer 180, and a cathode 190. The device 100 may be fabricated by sequentially depositing the layers described above. In some applications, the hole injection layer 120 and the hole transporting layer 130 are also collectively referred to as the hole transporting layer or referred to as the first hole transporting layer and the second hole transporting layer. However, there is a large difference between the two layers: the hole injection layer is generally in direct contact with the anode, and the thickness of the hole injection layer is generally smaller than the thickness of the hole transporting layer. In some applications, the hole injection layer is composed of a single material such as HATCN, or is composed of a hole transporting material doped with a p-type dopant. The properties and functions of the layers and example materials are described in more detail in U.S. Pat. No. 7,279,704 at cols. 6-10, the disclosure of which is incorporated herein by reference in its entirety.

More examples for each of these layers are available. For example, a flexible and transparent substrate-anode combination is disclosed in U.S. Pat. No. 5,844,363, which is incorporated by reference herein in its entirety. An example of a p-doped hole transporting layer is m-MTDATA doped with F4-TCNQ at a molar ratio of 1:50, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transporting layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. For example, the hole blocking layer is not a required layer and may be omitted in some structures. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
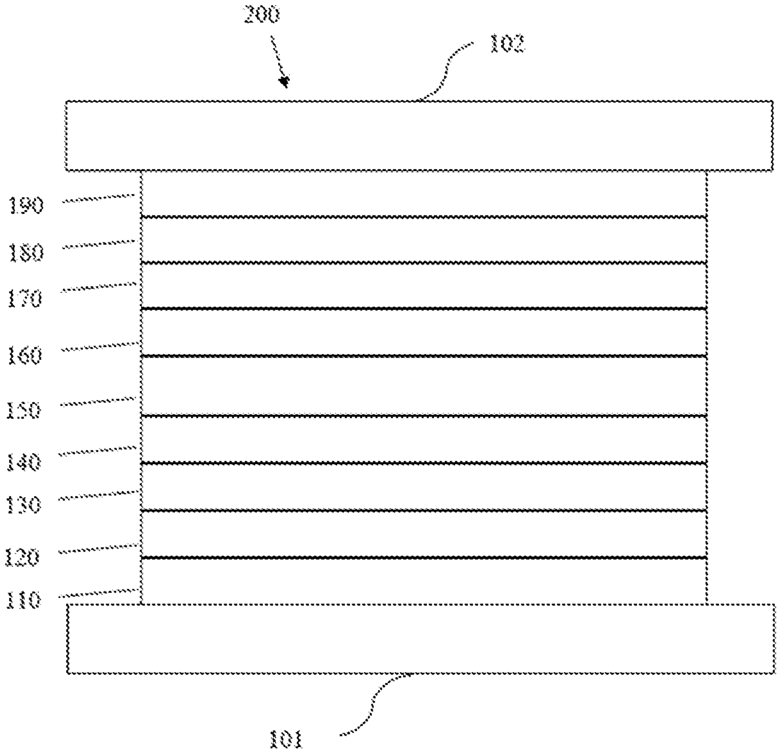
FIG. 2 is a structure diagram of an organic electroluminescent device 200 according to the present disclosure.

An OLED can be encapsulated by a barrier layer. FIG. 2 schematically shows an organic light emitting device 200 without limitation. FIG. 2 differs from FIG. 1 in that the organic light emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

Various OLED fabrication methods are available. Small molecule OLEDs are generally fabricated by vacuum thermal evaporation. Polymer OLEDs are fabricated by a solution process such as spin-coating, inkjet printing, and nozzle printing. If the material can be dissolved or dispersed in a solvent, the small molecule OLED can also be produced by a solution process. Each organic layer in the organic electroluminescent device provided by the present application may be prepared by an evaporation process or a solution process. For example, the first organic layer and the second organic layer in the present application may be prepared by an evaporation process or a solution process as required.

Herein, the energy levels (LUMO energy level: lowest unoccupied molecular orbital energy level; HOMO energy level: highest occupied molecular orbital energy level) of an organic material are measured by an electrochemical cyclic voltammetry method. Herein, all "HOMO energy levels" and "LUMO energy levels" are expressed as negative values, and the smaller the numerical value (i.e., the larger the absolute value), the deeper the energy level. Herein, the expression that the energy level is less than a certain number means that the numerical value of the energy level is less than this number, i.e., the numerical value of the energy level is more negative. For example, when the HOMO energy level or the LUMO energy level of a certain organic material is less than −4.5 eV, it means that the numerical value of the HOMO energy level or the LUMO energy level of the certain organic material is less than −4.5 eV or is more negative than −4.5 eV. Herein, the expression of $|LUMO_{first\ p\text{-}type\ dopant}-LUMO_{second\ p\text{-}type\ dopant}|$ means the absolute value of the difference between the LUMO energy level of the first p-type dopant and the LUMO energy level of the second p-type dopant.

The term "p-type dopant", also referred to as a p-type conductive doped material, refers to a dopant having an oxidation capability, and the p-type dopants known in the related art are generally organic electron acceptor compounds. The p-type dopant can be added to an organic layer of the device as a doped material to improve the conductivity of the layer. At present, the p-type dopants commonly used in the related art include F4-TCNQ and F6-TCNNQ. The structures of F4-TCNQ and F6-TCNNQ are as follows:

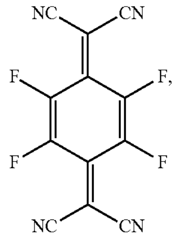
F4-TCNQ

, and

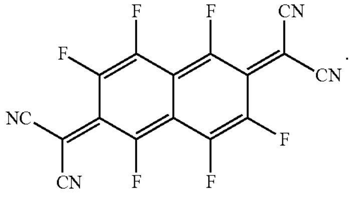
F6-TCNNQ

.

The p-type dopant described in the present disclosure is preferably the following compound having a structure of Formula 1, and more preferably, the p-type dopant is preferably the following compounds having a structure of Formula 15 to Formula 19.

The term "doping proportion" refers to the percentage of a material in an organic thin film to the total mass of the thin film. For example, in the present application, the doping proportion of the first p-type dopant in the first organic layer and the doping proportion of the second p-type dopant in the first organic layer refer to a percentage of the first p-type dopant or the second p-type dopant in the total mass of the first organic layer. When the first organic layer is composed of the first organic material, the first p-type dopant, and the second p-type dopant, the total mass of the first organic layer is a sum of messes of the first organic material, the first p-type dopant, and the second p-type dopant.

As used herein, the expression that materials are "different" means that two or more materials have different molecular structures and/or different energy levels. For example, the expression that the first p-type dopant is different from the second p-type dopant is intended to mean that the first p-type dopant and the second p-type dopant have different molecular structures and/or different energy levels.

As used herein, "top" means furthest away from the substrate/anode, while "bottom" means closest to the substrate/anode. Where a first layer is described as "disposed over" a second layer, the first layer is disposed further away from the substrate. Otherwise, where the first layer is described as "disposed below" the second layer, the first layer is disposed closer to the substrate. There may be other layers between the first and second layers, unless it is specified that the first layer is "in contact with" the second layer. For example, a cathode may be described as "disposed over" an anode, even though there are various organic layers in between.

As used herein, the "light-emitting unit" refers to an organic material layer that emits light by applying a voltage or a current, one "light-emitting unit" includes at least one emissive layer, and emissive layer may further contain a host material and a light-emitting material. The "light-emitting unit" further includes at least one pair of hole and electron transporting regions, for example, a hole injection layer, a hole transporting layer, an electron blocking layer, a hole blocking layer, an electron transporting layer, and an electron injection layer.

In terms of device structures, the OLEDs can be classified into conventional OLEDs having a single-layer structure and OLEDs having a series structure (also called a tandem structure). The conventional OLED includes only one light-emitting unit between the cathode and the anode, and the series OLED is stacked with multiple light-emitting units. One light-emitting unit generally includes at least one emissive layer, one hole transporting layer, and one electron transporting layer. Besides the above-mentioned layers, the light-emitting unit may further include a hole injection layer, an electron injection layer, a hole blocking layer, and an electron blocking layer. It is to be noted that although the conventional single-layer OLED has only one light-emitting unit, this light-emitting unit may include multiple emissive layers, and for example, the light-emitting unit may include one yellow emissive layer and one blue emissive layer. However, each light-emitting unit generally includes one pair of hole and electron transporting regions. The series OLED includes at least two light-emitting units, that is, the series OLED includes at least two pairs of hole and electron transporting regions. Therefore, for a tandem device, it may include multiple first organic layers described in the present disclosure. When multiple light-emitting units are arranged in a vertically-stacked physical form in an OLED to achieve a series characteristic on the circuit, such an OLED is referred to as a series OLED (in terms of circuit connections) or a tandem OLED (in terms of physical forms). That is, under the same brightness, the current density required by the series OLED is smaller than the current density required by the conventional single-layer OLED to achieve the effect of prolonging lifetime. On the contrary, at a constant current density, the brightness of the series OLED is higher than the brightness of the conventional single-layer OLED, but the voltage of the series OLED is increased accordingly. Adjacent light-emitting units of the series OLED are connected to each other by a charge generation layer, and the quality of the charge generation layer directly affects the parameters of the series OLED such as the voltage, lifetime and efficiency. Therefore, the charge generation layer region is required to be able to effectively generate holes and electrons and smoothly inject the holes and electrons to corresponding light-emitting units, is required to have greater transmittance in the visible range, and is also required to have stable performance and to be easy to prepare.

As used herein, the "charge generation layer (CGL)" is a layer disposed between two light-emitting units for providing electrons and holes and is composed of an n-type material layer (an n-type charge generation layer) and a p-type material layer (a p-type charge generation layer). The n-type material layer is in contact with an electron transporting layer or an electron injection layer of one light-emitting unit and may be a metal, for example, Yb and Li, or may be a metal compound, for example, Liq and LiF. The p-type material layer is generally an organic layer, is in contact with a hole injection layer or a hole transporting layer of an adjacent light-emitting unit, and provides holes for the latter. Therefore, the hole transporting region may also contain a p-type material layer. The p-type material layer may be a single-layer organic material layer or may be a composite layer of a hole transporting material doped with a p-type conductive doped material. The p-type charge generation layer may be used as the first organic layer described in the present application or may not be the first organic layer described in the present application.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, an n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butylmethylgermanylmethyl, triethylgermanylmethyl, triethylgermanylethyl, triisopropylgermanylmethyl, triisopropylgermanylethyl, trimethylsilylmethyl, trimethylsilylethyl, and trimethylsilylisopropyl, triisopropylsilylmethyl, triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups include saturated heterocyclic groups having 3 to 20 ring atoms and unsaturated non-aromatic heterocyclic groups having 3 to 20 ring atoms, wherein at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl—as used herein, includes non-condensed and condensed hetero-aromatic groups having 1 to 5 hetero-atoms, wherein at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthyl isopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, methyldiethylgermanyl, ethyldimethylgermanyl, tripropylgermanyl, tributylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates a germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, alkylgermanyl, arylgermanyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl having 6 to 20 carbon atoms, unsubstituted alkylgermanyl having 3 to 20 carbon atoms, unsubstituted arylgermanyl group having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen can also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions, etc.), that means the substituent may exist at a plurality of available substitution positions on its linking structure, the substituents present at a plurality of available substitution positions may be the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

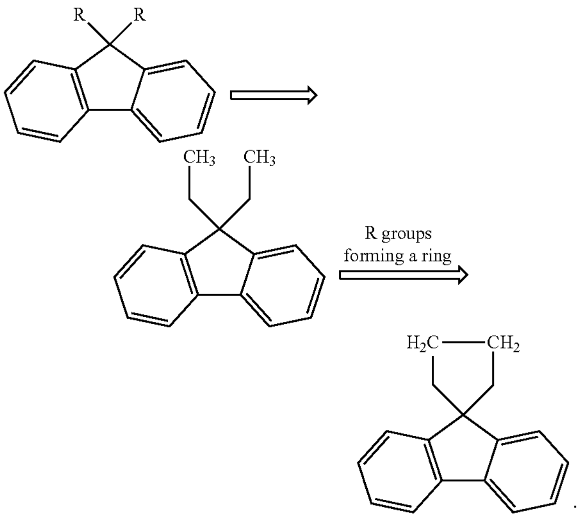

The expression that adjacent substituents can be optionally joined to form a ring is also intended to mean that two substituents bonded to carbon atoms which are directly bonded to each other are joined to each other via a chemical bond to form a ring, which can be exemplified by the following formula:

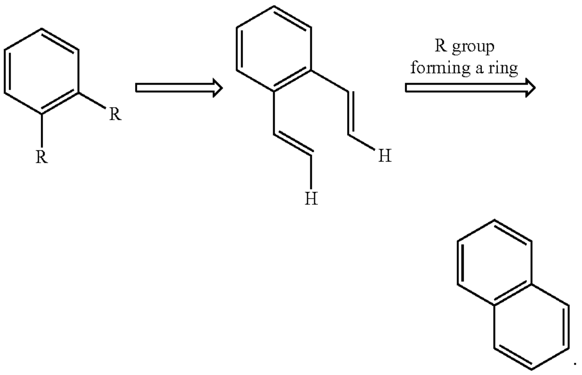

The expression that adjacent substituents can be optionally joined to form a ring is also intended to mean that two substituents bonded to a further distant carbon atom are joined to each other via a chemical bond to form a ring, which can be exemplified by the following formula:

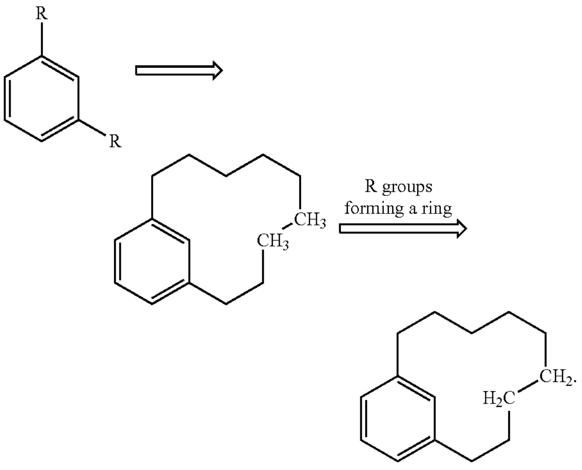

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

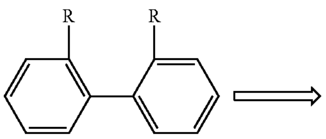

-continued

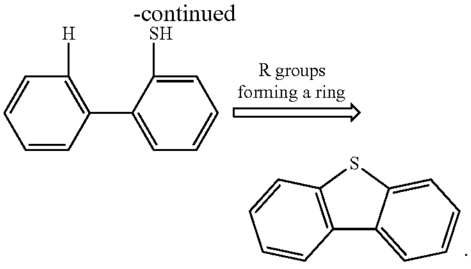

According to an embodiment of the present disclosure, an organic electroluminescent device is disclosed. The organic electroluminescent device includes an anode, a cathode, and a hole transporting region disposed between the anode and the cathode;

wherein the hole transporting region contains a first organic layer;

the first organic layer contains a first p-type dopant and a second p-type dopant; and the first p-type dopant is different from the second p-type dopant.

According to an embodiment of the present disclosure, the thickness of the first organic layer is not greater than 100 nm.

According to an embodiment of the present disclosure, the thickness of the first organic layer is not greater than 30 nm.

According to an embodiment of the present disclosure, the thickness of the first organic layer is not greater than 20 nm.

According to an embodiment of the present disclosure, the first organic layer is in direct contact with the anode.

According to an embodiment of the present disclosure, the doping proportion of the first p-type dopant in the first organic layer is the same as or different from the doping proportion of the second p-type dopant in the first organic layer.

According to an embodiment of the present disclosure, the doping proportion of the first p-type dopant and/or the second p-type dopant in the first organic layer is 0.1% to 50%.

According to an embodiment of the present disclosure, the doping proportion of the first p-type dopant and/or the second p-type dopant in the first organic layer is 0.5% to 16%.

According to an embodiment of the present disclosure, the doping proportion of the first p-type dopant and/or the second p-type dopant in the first organic layer is 0.5% to 10%.

According to an embodiment of the present disclosure, the sum of the masses of the first p-type dopant and the second p-type dopant is 1% to 60% of the total mass of the first organic layer.

According to an embodiment of the present disclosure, the sum of the masses of the first p-type dopant and the second p-type dopant is 10% to 20% of the total mass of the first organic layer.

According to an embodiment of the present disclosure, the LUMO of the first p-type dopant is different from the LUMO of the second p-type dopant.

According to an embodiment of the present disclosure, the LUMO of the first p-type dopant is greater than or equal to the LUMO of the second p-type dopant.

According to an embodiment of the present disclosure, the LUMO of the first p-type dopant is less than or equal to the LUMO of the second p-type dopant.

According to an embodiment of the present disclosure, $0.05\ eV \leq |LUMO_{first\ p\text{-}type\ dopant} - LUMO_{second\ p\text{-}type\ dopant}| \leq 0.8\ eV$.

According to an embodiment of the present disclosure, $0.1\ eV \leq |LUMO_{first\ p\text{-}type\ dopant} - LUMO_{second\ p\text{-}type\ dopant}| \leq 0.5\ eV$.

According to an embodiment of the present disclosure, the LUMO of the first p-type dopant and/or the LUMO of the second p-type dopant are less than or equal to −4.3 eV.

According to an embodiment of the present disclosure, the LUMO of the first p-type dopant and/or the LUMO of the second p-type dopant are less than or equal to −4.5 eV.

According to an embodiment of the present disclosure, the LUMO of the first p-type dopant and/or the LUMO of the second p-type dopant are greater than or equal to −6.0 eV.

According to an embodiment of the present disclosure, the LUMO of the first p-type dopant and/or the LUMO of the second p-type dopant are greater than or equal to −5.5 eV.

According to an embodiment of the present disclosure, the first organic layer further contains a third p-type dopant.

According to an embodiment of the present disclosure, the third p-type dopant is different from both the first p-type dopant and the second p-type dopant.

According to an embodiment of the present disclosure, the first organic layer further contains a first organic material.

According to an embodiment of the present disclosure, the HOMO of the first organic material is less than or equal to −4.5 eV.

According to an embodiment of the present disclosure, the HOMO of the first organic material is less than or equal to −4.8 eV.

According to an embodiment of the present disclosure, the HOMO of the first organic material is greater than or equal to −6.0 eV.

According to an embodiment of the present disclosure, the HOMO of the first organic material is greater than or equal to −5.5 eV.

According to an embodiment of the present disclosure, the organic electroluminescent device further contains at least one emissive layer, and the at least one emissive layer is disposed between the anode and the cathode.

According to an embodiment of the present disclosure, the at least one emissive layer contains a light-emitting material, and the light-emitting material is a phosphorescent material or a fluorescent material.

According to an embodiment of the present disclosure, the organic electroluminescent device further contains a charge generation layer, and the charge generation layer is disposed between the at least one emissive layer and the cathode and contains a p-type charge generation layer.

According to an embodiment of the present disclosure, the first organic layer is in contact with the p-type charge generation layer of the charge generation layer.

According to an embodiment of the present disclosure, the p-type charge generation layer contains the first p-type dopant or the second p-type dopant.

According to an embodiment of the present disclosure, the p-type charge generation layer contains the first organic material, the first p-type dopant and/or the second p-type dopant.

According to an embodiment of the present disclosure, the first organic layer is a p-type charge generation layer.

According to an embodiment of the present disclosure, the organic electroluminescent device has the following single-layer device structure: anode/first organic layer/hole transporting layer/electron blocking layer/emissive layer/hole blocking layer/electron transporting layer/electron injection layer/cathode, wherein the organic layer structures may be added or may not be added as required, and for example, the electron blocking layer and the hole blocking layer are optional layers and can be selected as required; the structure of each layer is not limited to a single-layer structure, and for example, the emissive layer may be a two-layer structure, i.e., two emissive layers are included.

According to an embodiment of the present disclosure, the organic electroluminescence device has the following tandem device structure: anode/first light-emitting unit/charge generation layer/second light-emitting unit/cathode, wherein the first light-emitting unit and the second light-emitting unit may be the same or different and each independently have the organic layer structures between the anode and the cathode in the single-layer device structure described above. A first charge generation layer and a third light-emitting unit may be further included between the second light-emitting unit and the cathode, i.e., the organic electroluminescence device has the following device structure: anode/first light-emitting unit/charge generation layer/second light-emitting unit/first charge generation layer/third light-emitting unit/cathode, wherein the third light-emitting unit and the first light-emitting unit may be the same or different, and the third light-emitting unit and the second light-emitting unit may also be the same or different.

According to an embodiment of the present disclosure, the p-type dopant has the structure represented by Formula 1:

Formula 1

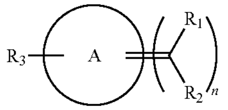

wherein n is selected from an integer from 1 to 5;

the ring A is, at each occurrence identically or differently, selected from a conjugated ring having 3 to 30 ring atoms;

$R_3$ represents mono-substitution, multiple substitutions or non-substitution;

$R_1$, $R_2$, and $R_3$ are, at each occurrence identically or differently, selected from hydrogen, deuterium or a substituent; and adjacent substituents $R_1$, $R_2$, $R_3$ can be optionally joined to form a ring.

Herein, the expression that the ring A is a conjugated ring having 3 to 30 ring atoms is intended to mean that the ring A is a cyclic structure having 3 to 30 ring atoms and the ring A has the structural feature of a conjugate. For example, the ring A includes, but is not limited to, the structures represented by Formula 2 to Formula 14 in the present application. The ring A may be a monocyclic structure or a polycyclic structure, wherein the polycyclic structure may be a parallel-ring structure or a fused-ring structure or may be an integrally conjugated structure formed by connecting two conjugated rings by a double bond, for example, the structure represented by Formula 13 in the present application. The ring A may be a carbocyclic ring or a heterocyclic ring.

Herein, the expression that adjacent substituents $R_1$, $R_2$, $R_3$ can be optionally joined to form a ring is intended to mean that any one or more of groups of adjacent substituents, such as substituents $R_3$, substituents $R_1$ and $R_2$, substituents $R_1$ and $R_3$, and substituents $R_2$ and $R_3$, can be joined to form a ring. Obviously, it is also possible that none of these substituents are joined to form a ring.

According to an embodiment of the present disclosure, the substituent is an electron-withdrawing group.

According to an embodiment of the present disclosure, n is selected from 1, 2 or 3.

According to an embodiment of the present disclosure, n is selected from 1 or 2.

According to an embodiment of the present disclosure, the ring A is, at each occurrence identically or differently, selected from a conjugated ring having 3 to 20 ring atoms.

According to an embodiment of the present disclosure, the ring A is, at each occurrence identically or differently, selected from a conjugated ring having 4 to 20 ring atoms.

According to an embodiment of the present disclosure, $R_1$ and/or $R_2$ are substituents containing at least one electron-withdrawing group.

According to an embodiment of the present disclosure, the Hammett constant of the electron-withdrawing group is greater than or equal to 0.05, preferably, is greater than or equal to 0.3, and more preferably, is greater than or equal to 0.5.

In the present disclosure, the Hammett substituent constant of the electron-withdrawing group is greater than or equal to 0.05, for example, greater than or equal to 0.1 or greater than or equal to 0.2, preferably, is greater than or equal to 0.3, and more preferably, is greater than or equal to 0.5. The electron-withdrawing capability of the electron-withdrawing group is relatively strong, which can significantly reduce the LUMO energy level of the compound and achieve the effect of improving the charge mobility.

It is to be noted that the Hammett substituent constant includes a para constant and/or meta constant of the Hammett substituent, and as long as both the para constant and the meta constant are greater than 0 and one of the para constant and the meta constant is greater than or equal to 0.05, the Hammett substituent can be used as the group selected in the present disclosure.

According to an embodiment of the present disclosure, the electron-withdrawing group is selected from the group consisting of: halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group, an aza-aromatic ring group and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group and an aza-aromatic ring group: alkyl having 1 to 20 carbon atoms, cycloalkyl having 3 to 20 ring carbon atoms, heteroalkyl having 1 to 20 carbon atoms, heterocyclyl having 3 to 20 ring atoms, arylalkyl having 7 to 30 carbon atoms, alkoxy having 1 to 20 carbon atoms, aryloxy having 6 to 30 carbon atoms, alkenyl having 2 to 20 carbon atoms, alkynyl having 2 to 20 carbon atoms, aryl having 6 to 30 carbon atoms, heteroaryl having 3 to 30 carbon atoms, alkylsilyl having 3 to 20 carbon atoms, arylsilyl having 6 to 20 carbon atoms, and combinations thereof.

According to an embodiment of the present disclosure, the electron-withdrawing group is selected from the group consisting of: halogen, a nitroso group, a nitro group, an acyl group, a carbonyl group, a carboxylic acid group, an ester group, $SF_5$, a boryl group, a sulfinyl group, a sulfonyl group, a phosphoroso group, an aza-aromatic ring group and any one of the following groups substituted by one or more of halogen, a nitroso group, a nitro group, an acyl group, a carbonyl group, a carboxylic acid group, an ester group, a cyano group, an isocyano group, SCN, OCN, $SF_5$, a boryl group, a sulfinyl group, a sulfonyl group, a phosphoroso group and an aza-aromatic ring group: alkyl having 1 to 20 carbon atoms, cycloalkyl having 3 to 20 ring carbon atoms, heteroalkyl having 1 to 20 carbon atoms, arylalkyl having 7 to 30 carbon atoms, alkoxy having 1 to 20 carbon atoms, aryloxy having 6 to 30 carbon atoms, alkenyl having 2 to 20 carbon atoms, alkynyl having 2 to 20 carbon atoms, aryl having 6 to 30 carbon atoms, heteroaryl having 3 to 30 carbon atoms, alkylsilyl having 3 to 20 carbon atoms, arylsilyl having 6 to 20 carbon atoms, and combinations thereof.

According to an embodiment of the present disclosure, the electron-withdrawing group is selected from the group consisting of: fluorine, an acyl group, a carbonyl group, an ester group, $SF_5$, a boryl group, an aza-aromatic ring group and any one of the following groups substituted by one or more of fluorine, a cyano group, an isocyano group, SCN, OCN, $SF_5$, $CF_3$, $OCF_3$, $SCF_3$, and an aza-aromatic ring group: alkyl having 1 to 20 carbon atoms, cycloalkyl having 3 to 20 ring carbon atoms, heteroalkyl having 1 to 20 carbon atoms, arylalkyl having 7 to 30 carbon atoms, alkoxy having 1 to 20 carbon atoms, aryloxy having 6 to 30 carbon atoms, alkenyl having 2 to 20 carbon atoms, alkynyl having 2 to 20 carbon atoms, aryl having 6 to 30 carbon atoms, heteroaryl having 3 to 30 carbon atoms, alkylsilyl having 3 to 20 carbon atoms, arylsilyl having 6 to 20 carbon atoms, and combinations thereof.

According to an embodiment of the present disclosure, the ring A is, at each occurrence identically or differently, selected from the group consisting of Formula 2 to Formula 14:

Formula 2

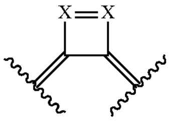

Formula 3

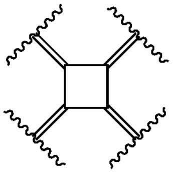

Formula 4

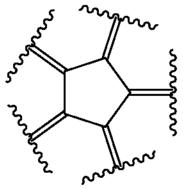

-continued

Formula 5

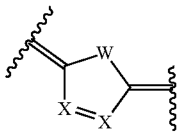

Formula 6

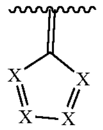

Formula 7

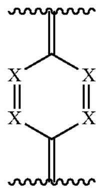

Formula 8

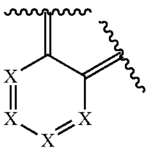

Formula 9

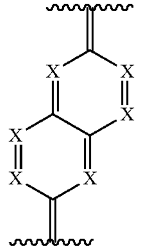

Formula 10

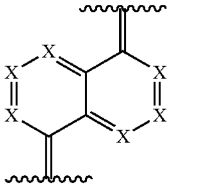

Formula 11

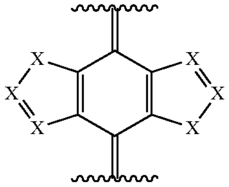

Formula 12

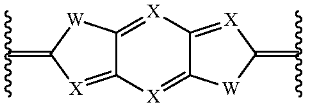

Formula 13

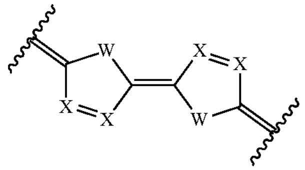

-continued

Formula 14

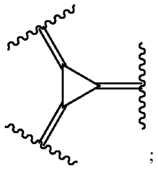

;

wherein

X is, at each occurrence identically or differently, selected from the group consisting of N and $CR_3$;

W is, at each occurrence identically or differently, selected from the group consisting of O, S, Se, and $NR_3$;

$R_3$ represents mono-substitution, multiple substitutions or non-substitution;

$R_1$, $R_2$, and $R_3$ are, at each occurrence identically or differently, selected from hydrogen, deuterium or a substituent;

adjacent substituents $R_1$, $R_2$, and $R_3$ be optionally joined to form a ring; and "∼∼" represents a position where any one of Formula 2 to Formula 14 is joined at the double bond in Formula 1.

According to an embodiment of the present disclosure, the p-type dopant has a structure represented by the following formulas:

Formula 15

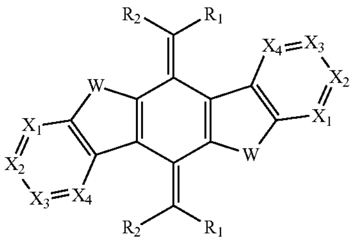

Formula 16

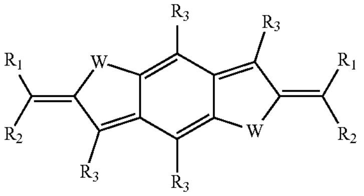

Formula 17

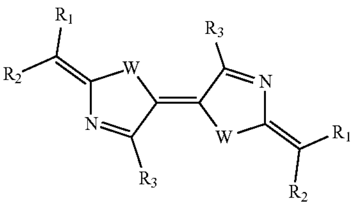

Formula 18

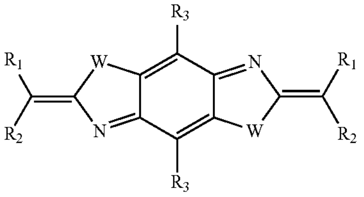

-continued

Formula 19

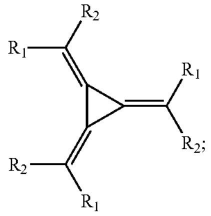

wherein $X_1$, $X_2$, $X_3$, and $X_4$ are, at each occurrence identically or differently, selected from the group consisting of N and $CR_3$;

W is, at each occurrence identically or differently, selected from the group consisting of O, S, Se, and $NR_3$;

$R_1$, $R_2$, and $R_3$ are, at each occurrence identically or differently, selected from hydrogen, deuterium or a substituent; and adjacent substituents $R_1$, $R_2$, $R_3$ can be optionally joined to form a ring.

According to an embodiment of the present disclosure, the substituent is halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfanyl group, a sulfonyl group, a phosphino group, or combinations thereof.

According to an embodiment of the present disclosure, W is, at each occurrence identically or differently, selected from O, S or Se.

According to an embodiment of the present disclosure, W is, at each occurrence identically or differently, selected from O or S.

According to an embodiment of the present disclosure, W is selected from O.

According to an embodiment of the present disclosure, W is, at each occurrence identically or differently, selected from $NR_3$, and $R_3$ is, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, and combinations thereof.

According to an embodiment of the present disclosure, W is, at each occurrence identically or differently, selected from $NR_3$, and $R_3$ is, at each occurrence identically or differently, selected from the group consisting of: substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, and combinations thereof.

According to an embodiment of the present disclosure, the p-type dopant is selected from the group consisting of, but not limited to, the following structures:

1-1

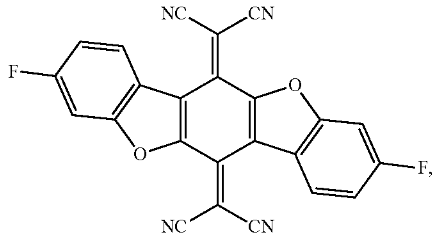

1-2

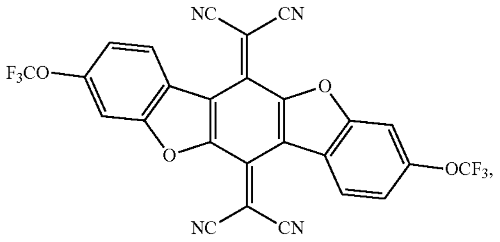

1-3

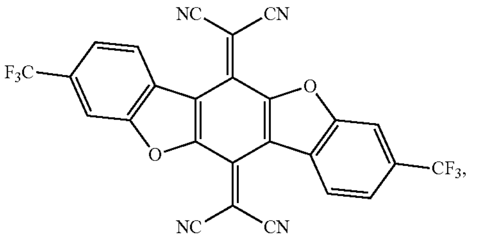

1-4

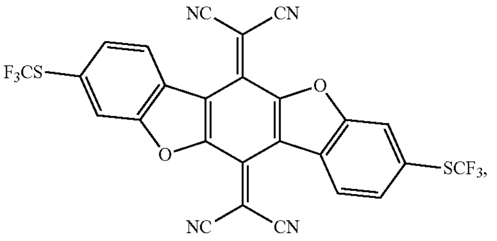

-continued 1-5

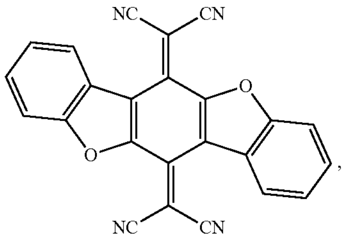

1-6

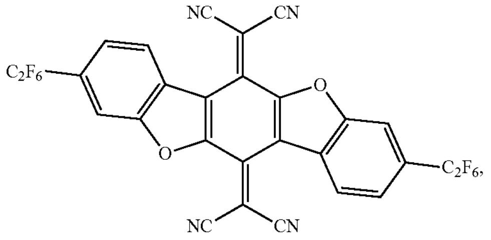

1-7

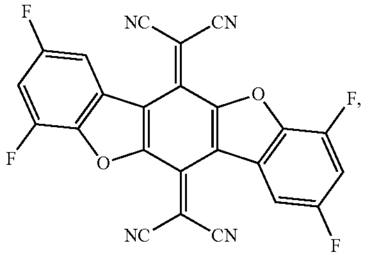

1-8

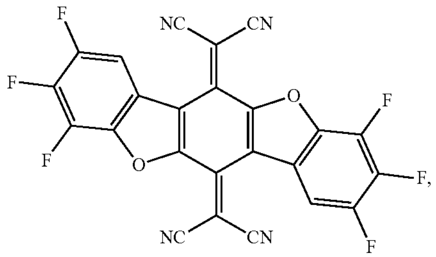

1-9

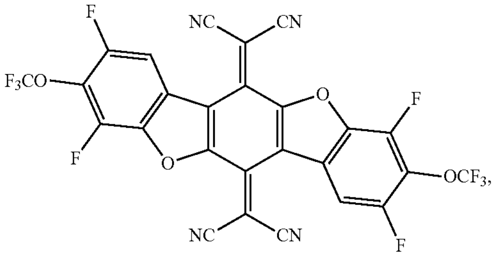

1-10

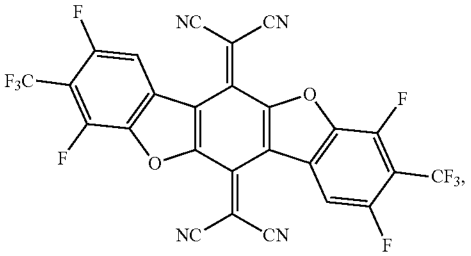

-continued
1-11
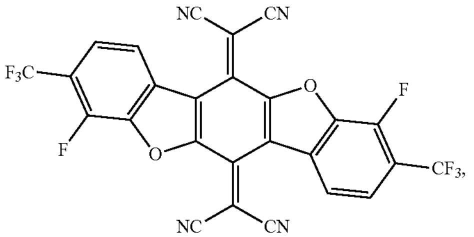
1-12
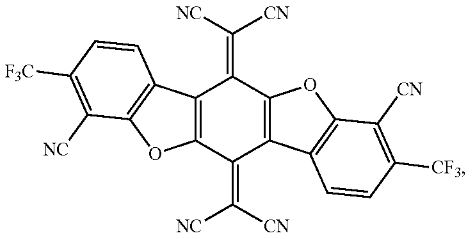
1-13
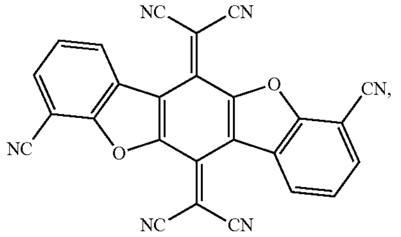
1-14
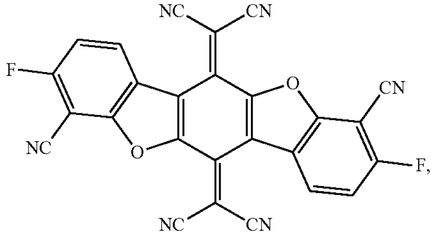
1-15
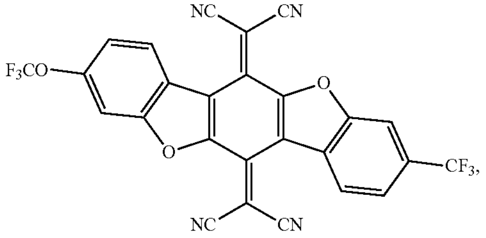
1-16
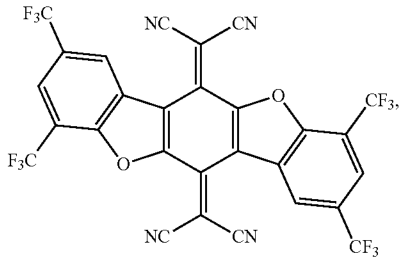
-continued
1-17
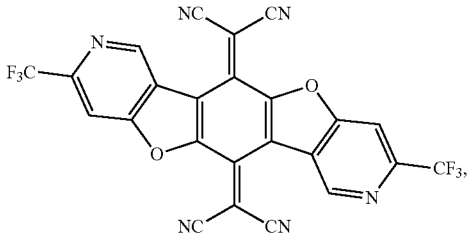
1-18
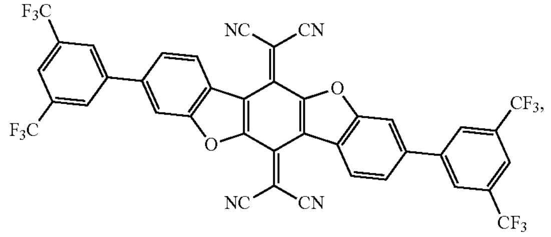
1-19
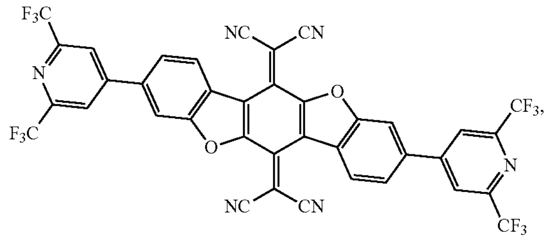
1-20
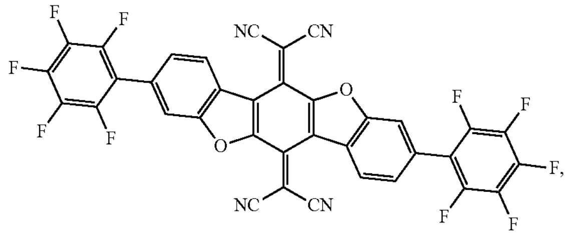
1-21
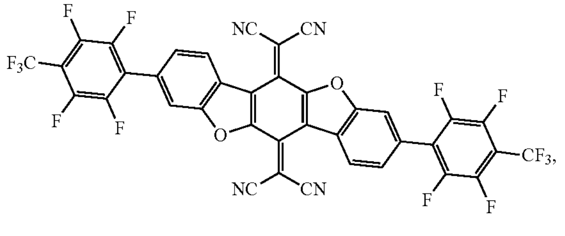
1-22
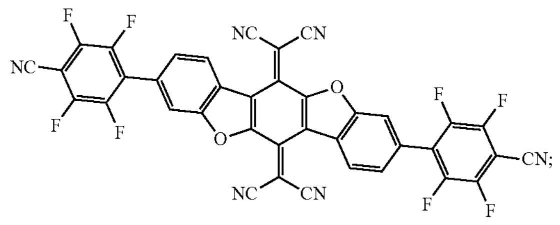

-continued
2-1
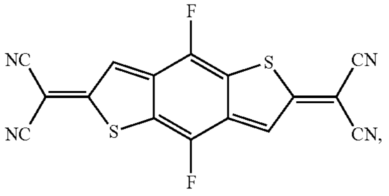
2-2
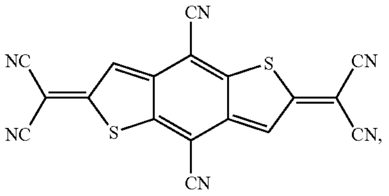
2-3
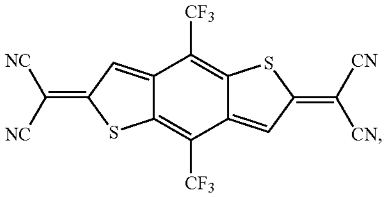
2-4
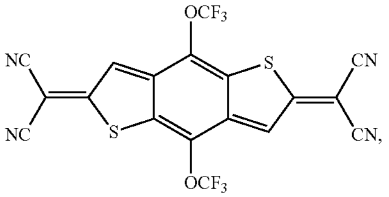
2-5
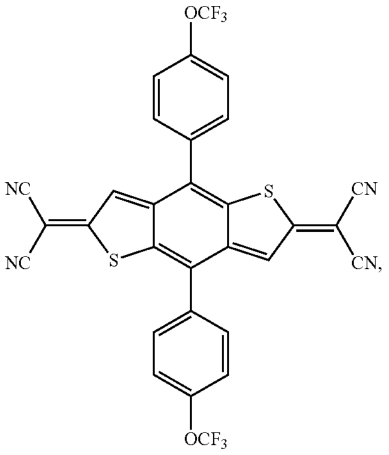
-continued
2-6
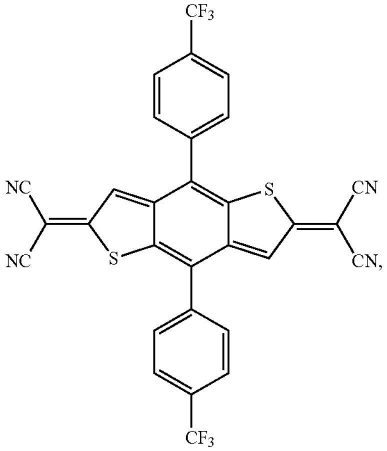
2-7
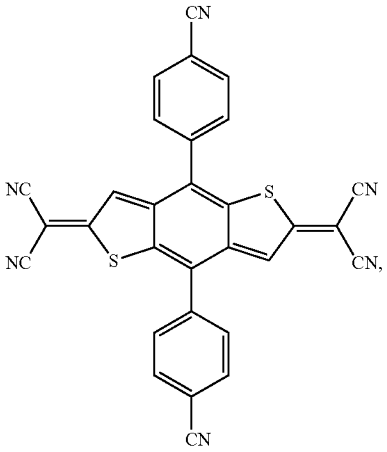
2-8
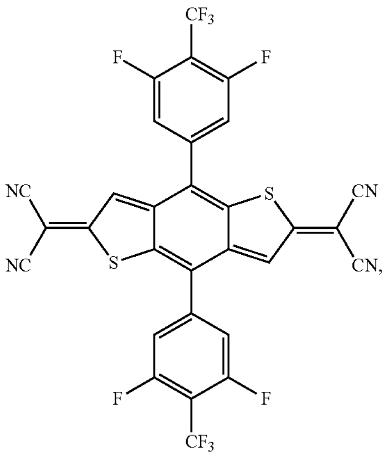

-continued
2-9
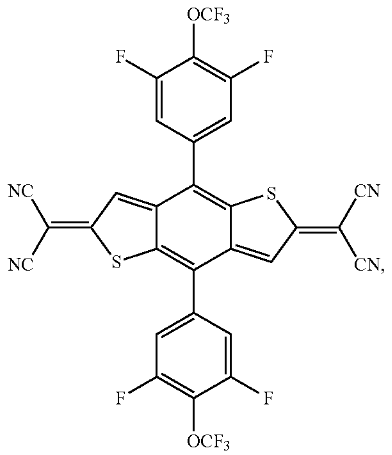
2-10
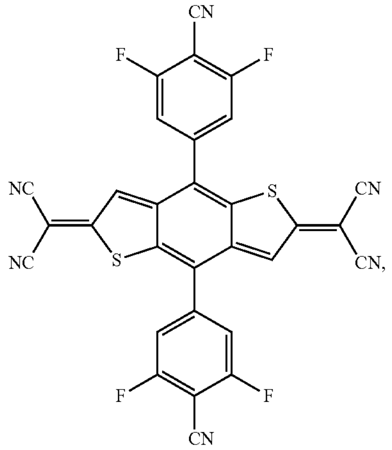
2-11
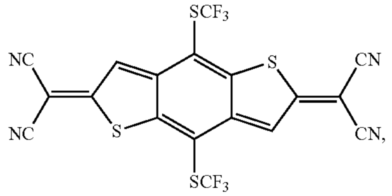
2-12
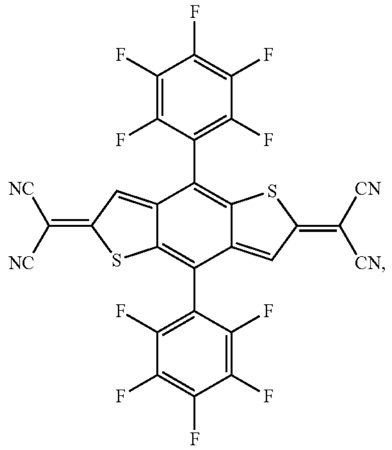
-continued
2-13
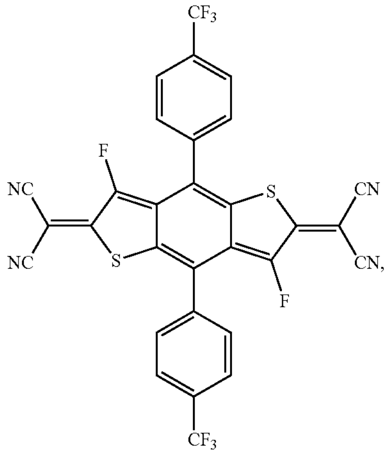
2-14
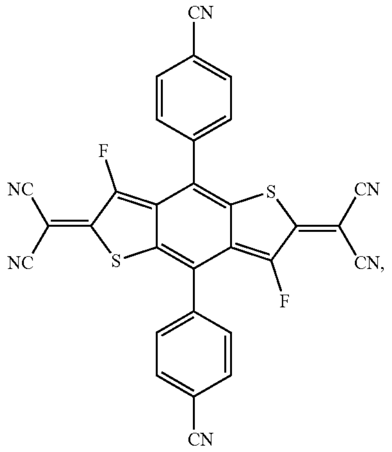
2-15
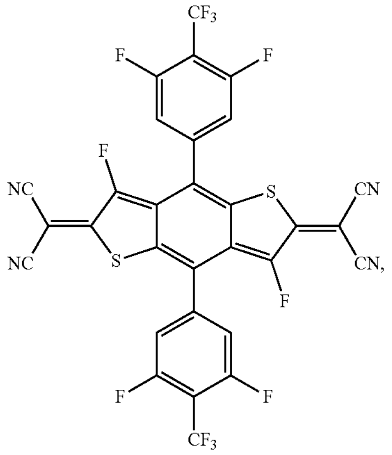

-continued
2-16
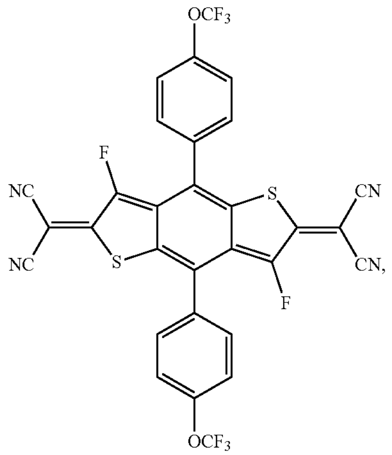
2-17
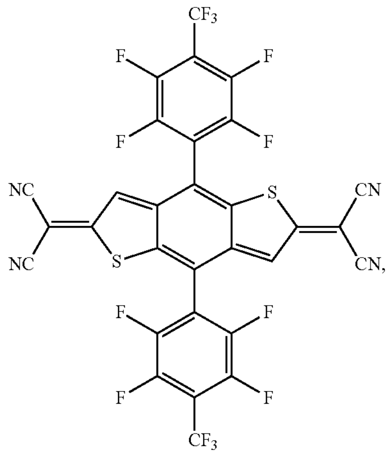
2-18
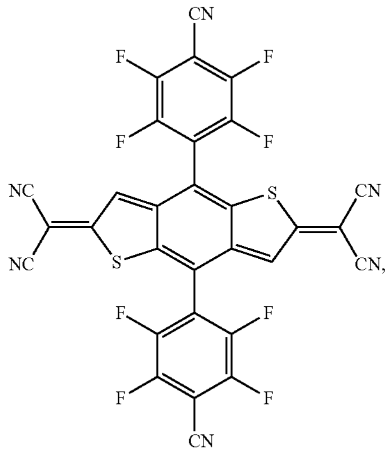
-continued
2-19
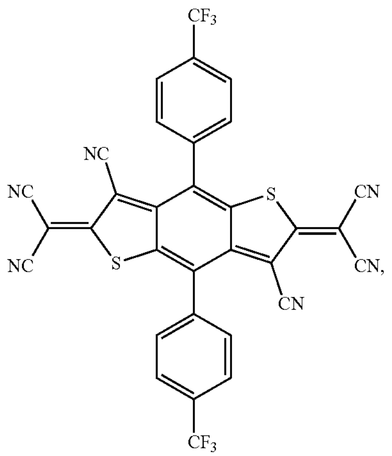
2-20
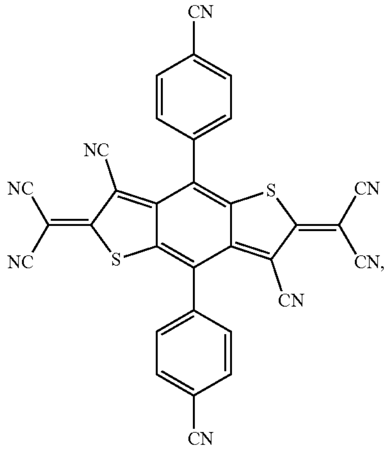
2-21
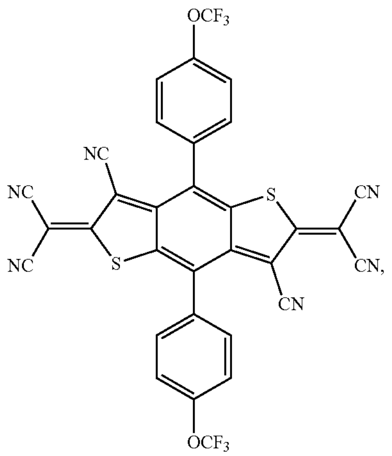

-continued
2-22
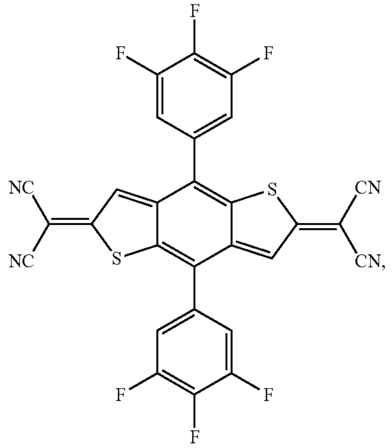
2-23
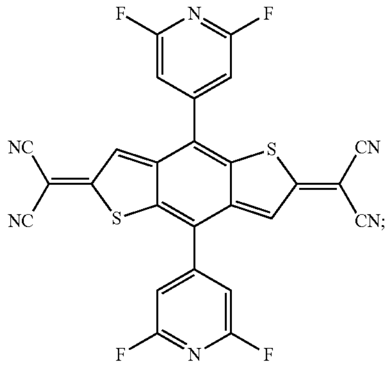
3-1
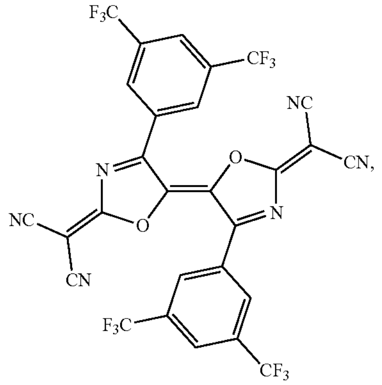
3-2
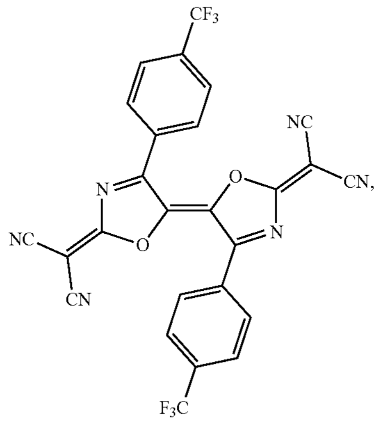
-continued
3-3
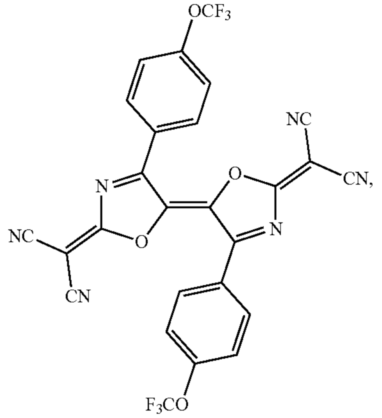
3-4
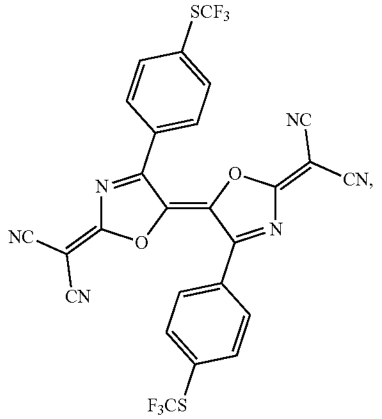
3-5
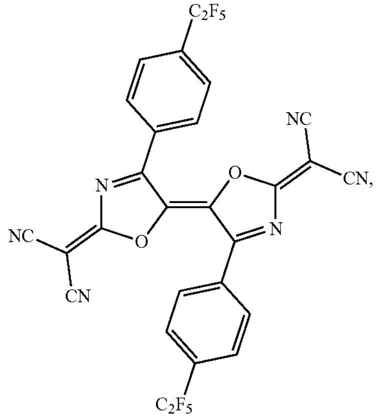
3-6
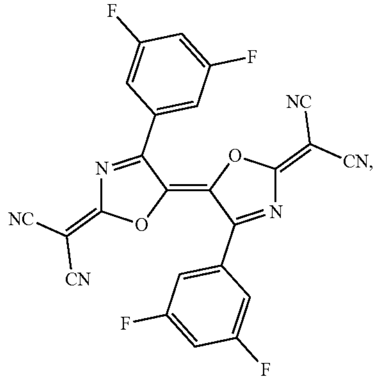

-continued
3-7
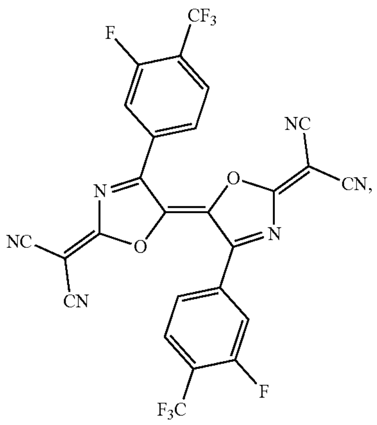
3-8
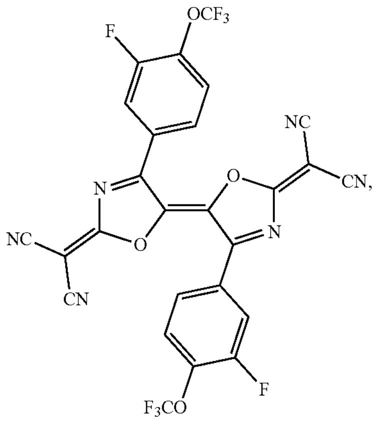
3-9
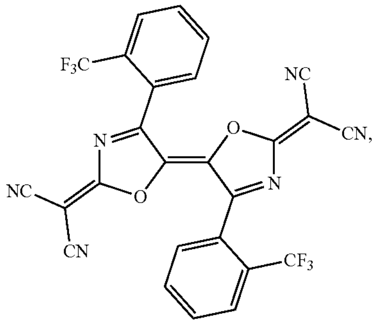
3-10
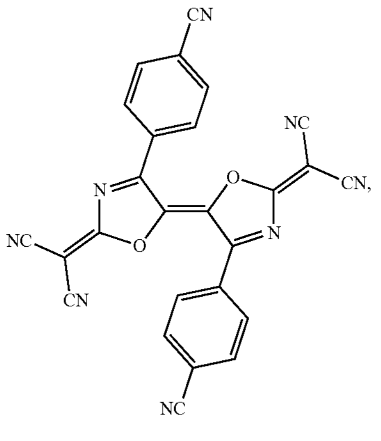
-continued
3-11
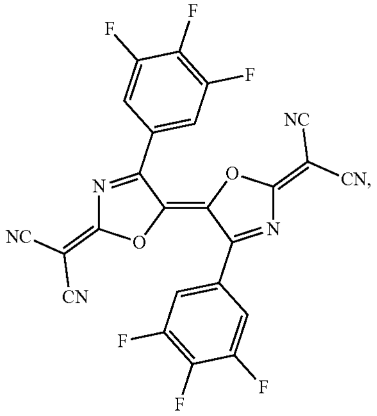
3-12
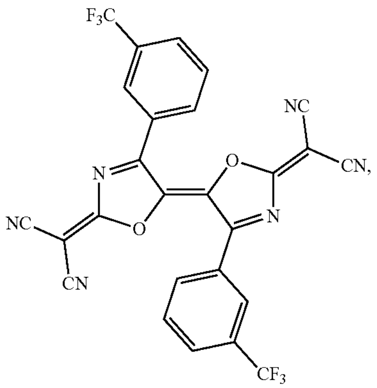
3-13
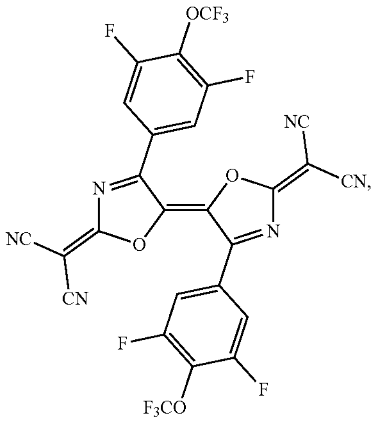
3-14
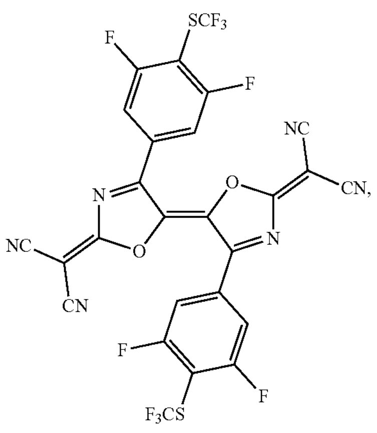

-continued
3-15
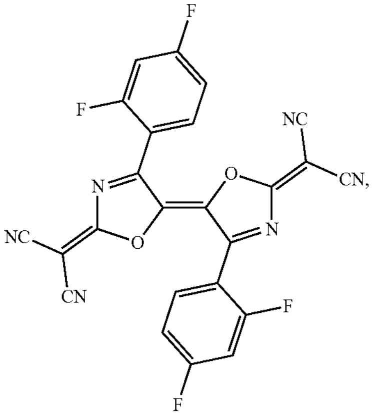
3-16
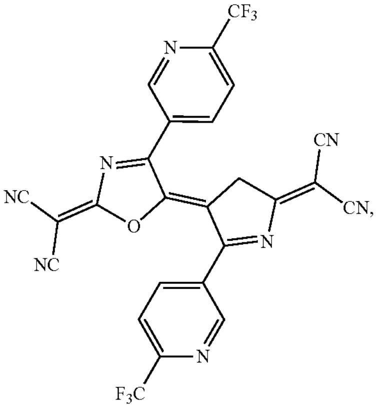
3-17
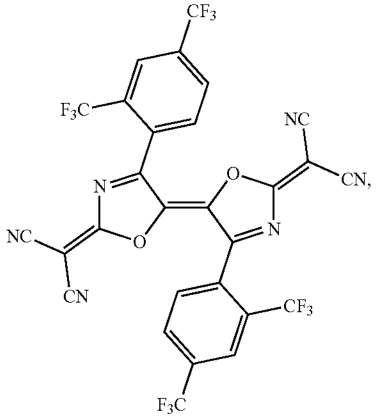
3-18
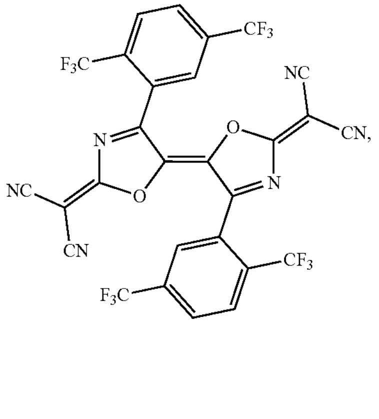
-continued
3-19
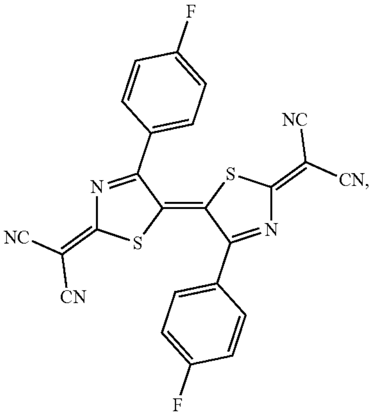
3-20
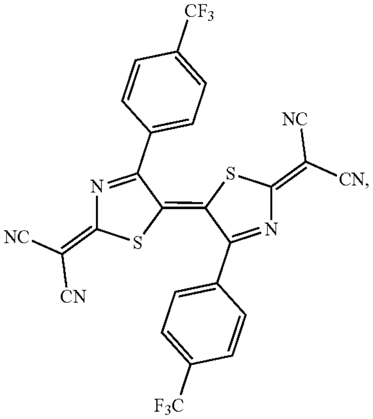
3-21
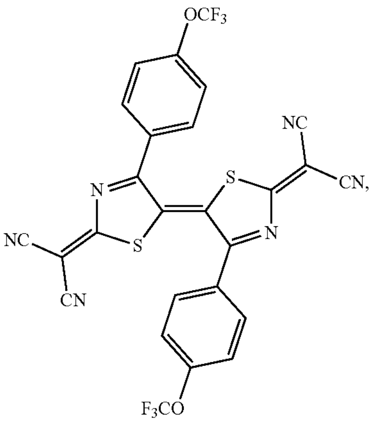

-continued
3-22
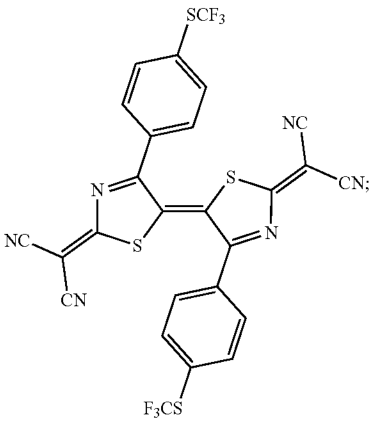
4-1
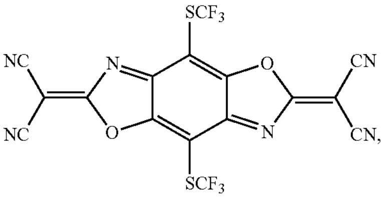
4-2
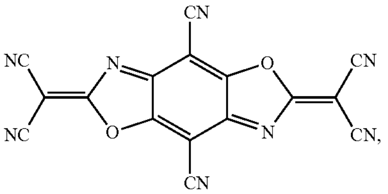
4-3
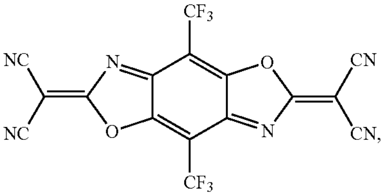
4-4
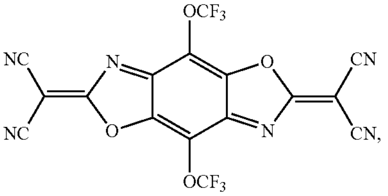
-continued
4-5
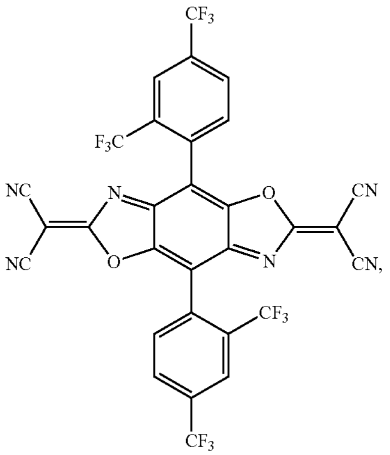
4-6
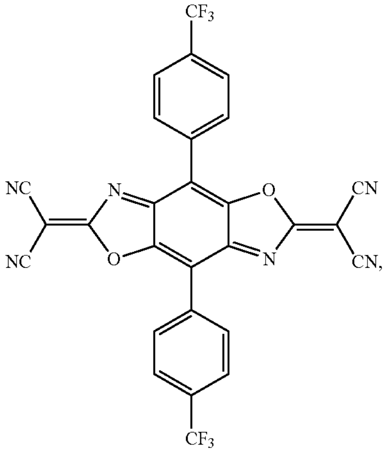
4-7
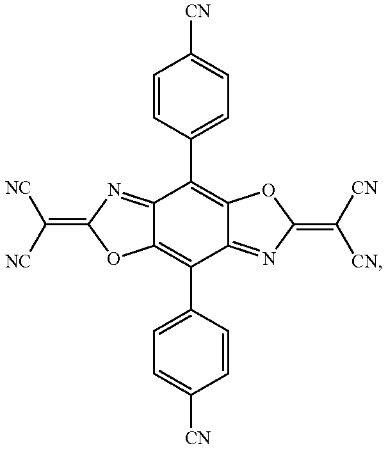

-continued
4-8
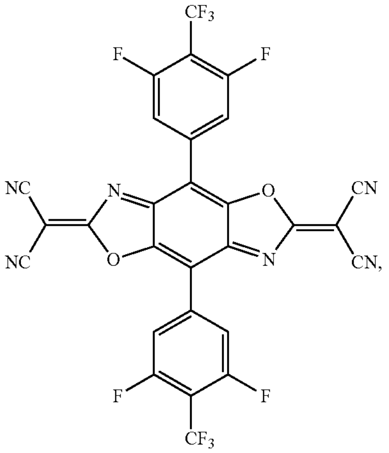
4-9
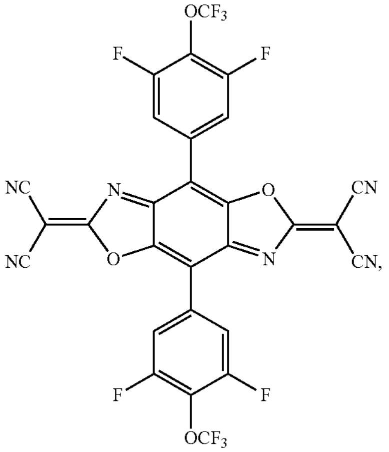
4-10
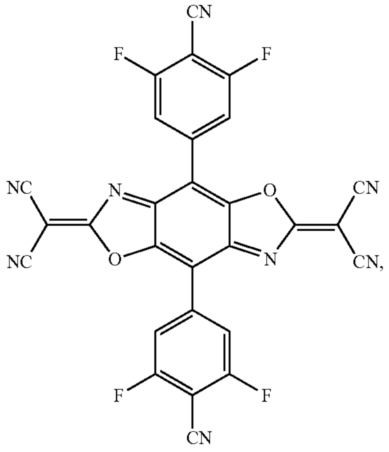
-continued
4-11
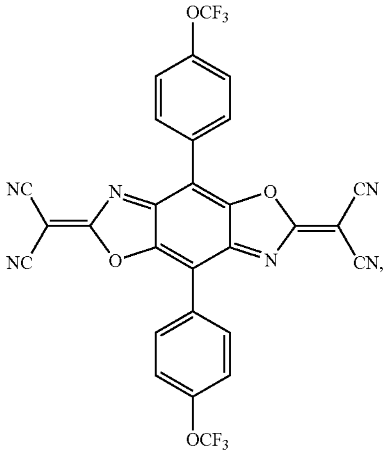
4-12
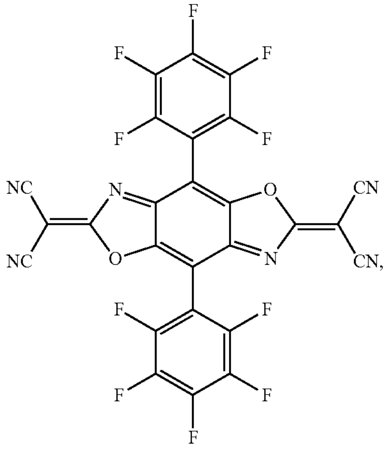
4-13
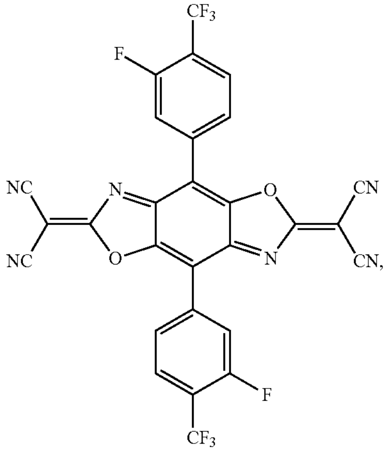

-continued
4-14
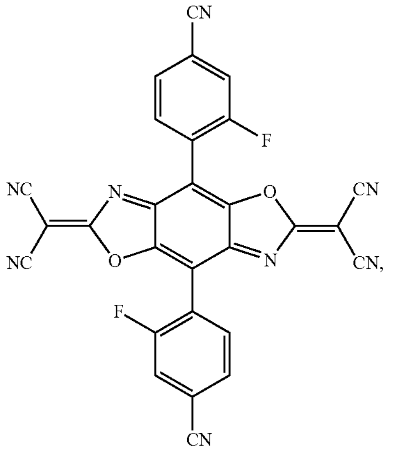
4-15
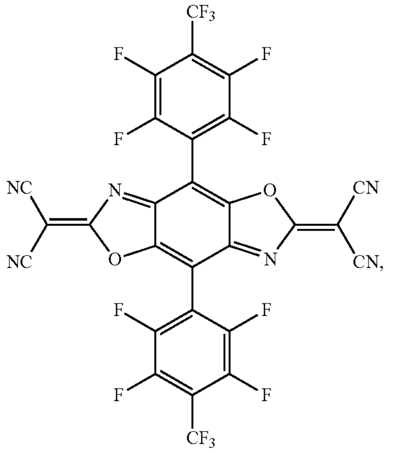
4-16
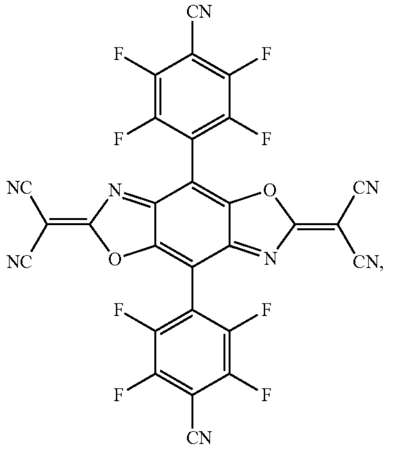
-continued
4-17
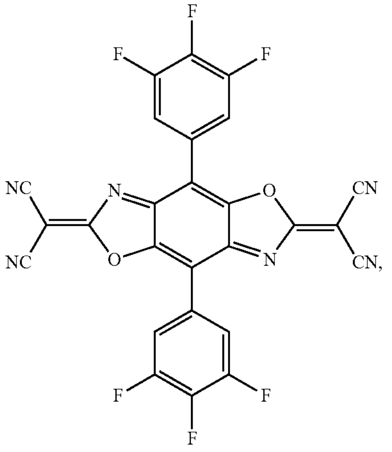
4-18
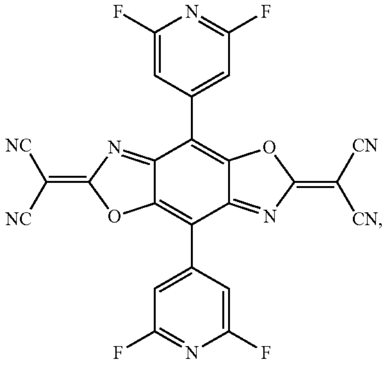
4-19
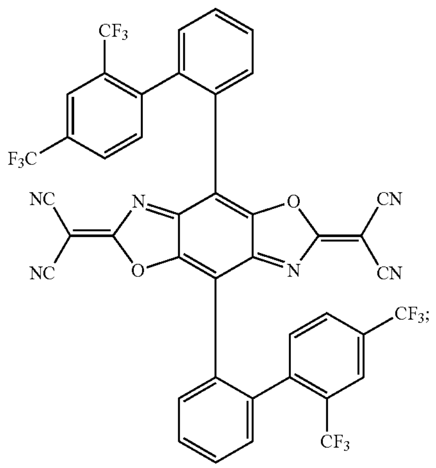

5-1

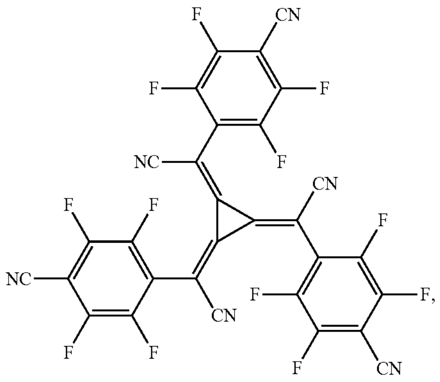

5-2

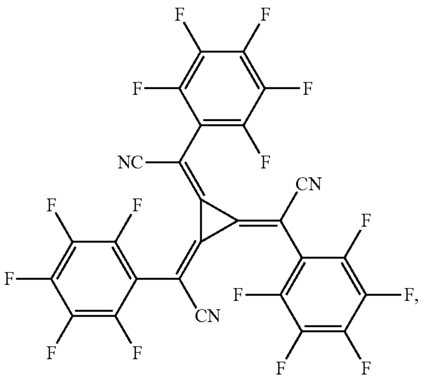

5-3

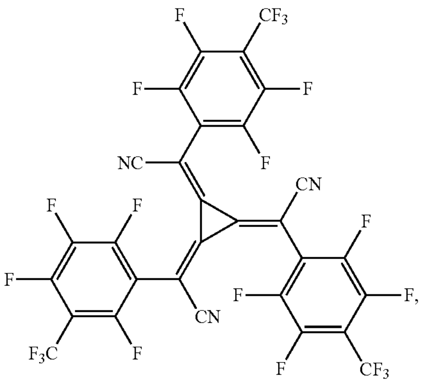

5-4

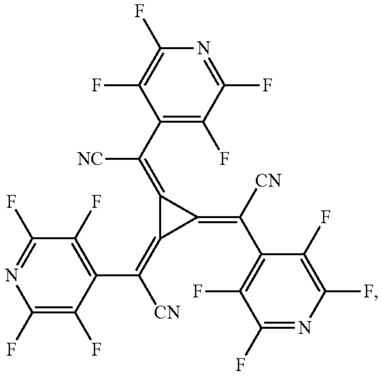

5-5

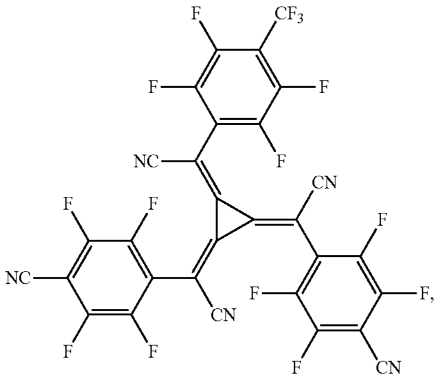

5-6

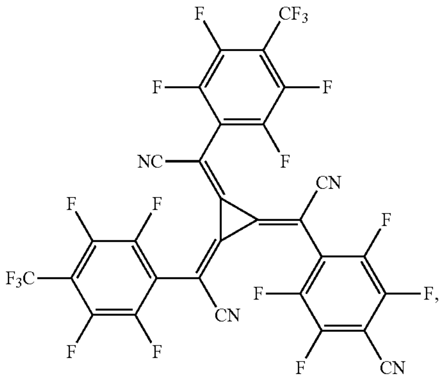

and 5-7

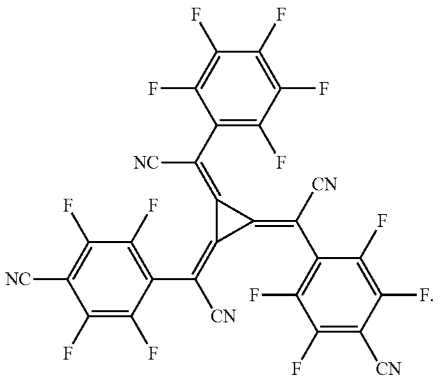

According to an embodiment of the present disclosure, the first organic material is selected from the group consisting of the following compounds: a compound having a triarylamine unit, a spirobifluorene compound, a pentacene compound, an oligothiophene compound, an oligophenyl compound, an oligophenylene ethylene compound, an oligofluorene compound, a porphyrin complex or a metallic phthalocyanine complex.

According to an embodiment of the present disclosure, the first organic material is a hole transporting material.

According to an embodiment of the present disclosure, the first organic material contains one or more chemical structural units selected from the group consisting of: triarylamine, carbazole, fluorene, spirobifluorene, thiophene, furan, phenyl, oligophenylene ethylene, oligofluorene, and combinations thereof.

According to an embodiment of the present disclosure, the first organic material contains a monotriarylamine structural unit or a bistriarylamine structural unit.

According to an embodiment of the present disclosure, the first organic material contains any one or more chemical structural units selected from the group consisting of: a monotriarylamine-carbazole structural unit, a monotriarylamine-thiophene structural unit, a monotriarylamine-furan structural unit, a monotriarylamine-fluorene structural unit, a bistriarylamine-carbazole structural unit, a bistriarylamine-thiophene structural unit, a bistriarylamine-furan structural unit, and a bistriarylamine-fluorene structural unit.

According to an embodiment of the present disclosure, the first organic material is a monotriarylamine compound or a bistriarylamine compound.

According to an embodiment of the present disclosure, the first organic material is selected from a monotriarylamine-carbazole compound, a monotriarylamine-thiophene compound, a monotriarylamine-furan compound, a monotriarylamine-fluorene compound, a bistriarylamine-carbazole compound, a bistriarylamine-thiophene compound, a bistriarylamine-furan compound or a bistriarylamine-fluorene compound.

According to an embodiment of the present disclosure, the first organic material containing a monotriarylamine structural unit has a structure represented by Formula 20 or Formula 21:

Formula 20

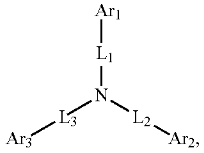

and

Formula 21

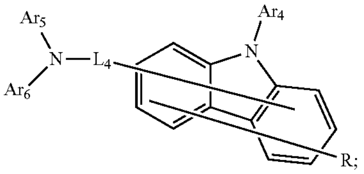

wherein $Ar_1$, $Ar_2$, $Ar_3$, $Ar_4$, $Ar_5$, and $Ar_6$ are, at each occurrence identically or differently, selected from substituted or unsubstituted aryl having 6 to 30 carbon atoms or substituted or unsubstituted heteroaryl having 3 to 30 carbon atoms; and the strictures of $Ar_1$, $Ar_2$, $Ar_3$, $Ar_4$, $Ar_5$, and $Ar_6$ do not contain carbazole;

$L_1$, $L_2$, $L_3$, and $L_4$ are, at each occurrence identically or differently, selected from a single bond, substituted or unsubstituted arylene having 6 to 30 carbon atoms, substituted or unsubstituted heteroarylene having 3 to 30 carbon atoms or combinations thereof; and the strictures of $L_1$, $L_2$, $L_3$, and $L_4$ do not contain carbazole;

R represents, at each occurrence identically or differently, mono-substitution, multiple substitutions or non-substitution; and R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, substituted or unsubstituted heterocyclyl having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, an acyl group, a carbonyl group, a carboxylic acid group, an ester group, a cyano group, an isocyano group, a hydroxyl group, a sulfanyl group, a sulfanyl group, a sulfonyl group, a phosphino group, or combinations thereof; and the stricture of R does not contain carbazole.

According to an embodiment of the present disclosure, $Ar_1$, $Ar_2$, $Ar_3$, $Ar_4$, $Ar_5$, and $Ar_6$ are, at each occurrence identically or differently, selected from substituted or unsubstituted phenyl, substituted or unsubstituted biphenyl, substituted or unsubstituted terphenyl, substituted or unsubstituted naphthyl, substituted or unsubstituted dibenzofuryl, substituted or unsubstituted dibenzothienyl, substituted or unsubstituted dibenzoselenophenyl, substituted or unsubstituted phenanthryl, substituted or unsubstituted triphenylene, substituted or unsubstituted pyridyl, substituted or unsubstituted anthryl, substituted or unsubstituted pyrenyl, substituted or unsubstituted fluorenyl or combinations thereof.

According to an embodiment of the present disclosure, $L_1$, $L_2$, $L_3$, and $L_4$ are, at each occurrence identically or differently, selected from a single bond, substituted or unsubstituted phenylene, substituted or unsubstituted biphenylene, substituted or unsubstituted terphenylene, substituted or unsubstituted naphthylene, substituted or unsubstituted dibenzofurylene, substituted or unsubstituted dibenzothienylene, substituted or unsubstituted dibenzoselenophenylene, substituted or unsubstituted phenanthrylene, substituted or unsubstituted triphenylenylene, substituted or unsubstituted pyridylene, substituted or unsubstituted anthrylene, substituted or unsubstituted pyrenylene, substituted or unsubstituted fluorenylidene or combinations thereof.

According to an embodiment of the present disclosure, the first organic material containing a bistriarylamine structural unit has a structure represented by Formula 22:

Formula 22

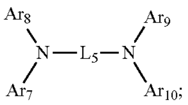

wherein $Ar_7$, $Ar_8$, $Ar_9$, and $Ar_{10}$ are selected from substituted or unsubstituted aryl having 6 to 30 carbon atoms or substituted or unsubstituted heteroaryl having 3 to 30 carbon atoms;

adjacent substituents $Ar_7$ and $Ar_8$ are not joined to form a ring or adjacent substituents $Ar_9$ and $Ar_{10}$ are not joined to form a ring; and $L_5$ is selected from substituted or unsubstituted arylene having 6 to 30 carbon atoms or substituted or unsubstituted heteroarylene having 3 to 30 carbon atoms.

According to an embodiment of the present disclosure, $Ar_7$, $Ar_8$, $Ar_9$, and $Ar_{10}$ are, at each occurrence identically or differently, selected from substituted or unsubstituted phenyl, substituted or unsubstituted biphenyl, substituted or unsubstituted terphenyl, substituted or unsubstituted naphthyl, substituted or unsubstituted carbazolyl, substituted or unsubstituted dibenzofuryl, substituted or unsubstituted dibenzothienyl, substituted or unsubstituted dibenzoselenophenyl, substituted or unsubstituted phenanthryl, substituted or unsubstituted triphenylene, substituted or unsubstituted pyridyl, substituted or unsubstituted anthryl, substituted or unsubstituted pyrenyl, substituted or unsubstituted fluorenyl or combinations thereof wherein adjacent substituents $Ar_7$ and $Ar_8$ are not joined to form a ring or adjacent substituents $Ar_9$ and $Ar_{10}$ are not joined to form a ring.

According to an embodiment of the present disclosure, $L_5$ is selected from a single bond, substituted or unsubstituted phenylene, substituted or unsubstituted biphenylene, substituted or unsubstituted terphenylene, substituted or unsubstituted naphthylene, substituted or unsubstituted carbazolylene, substituted or unsubstituted dibenzofurylene, substituted or unsubstituted dibenzothienylene, substituted or unsubstituted dibenzoselenophenylene, substituted or unsubstituted phenanthrylene, substituted or unsubstituted triphenylenylene, substituted or unsubstituted pyridylene, substituted or unsubstituted anthrylene, substituted or unsubstituted pyrenylene, substituted or unsubstituted fluorenylidene or combinations thereof.

According to an embodiment of the present disclosure, the first organic material contains one or more chemical structural units selected from the group consisting of: triarylamine, carbazole, fluorene, spirobifluorene, thiophene, furan, phenyl, oligophenylene ethylene, oligofluorene, and combinations thereof.

According to an embodiment of the present disclosure, the first organic material is selected from the group consisting of, but not limited to, the following structures:

HT-1

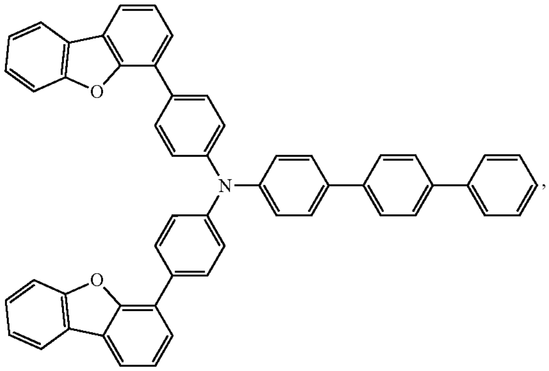

,

-continued

HT-2

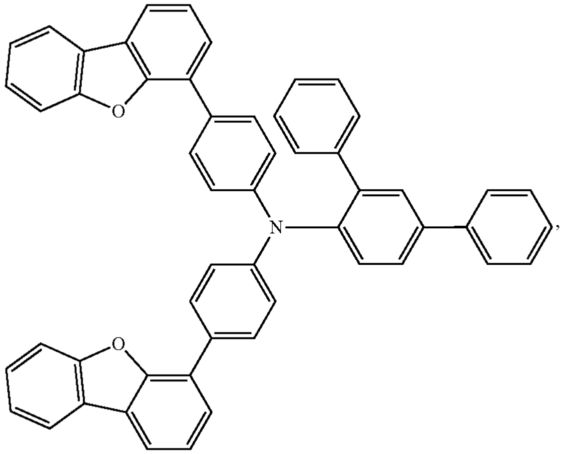

,

HT-3

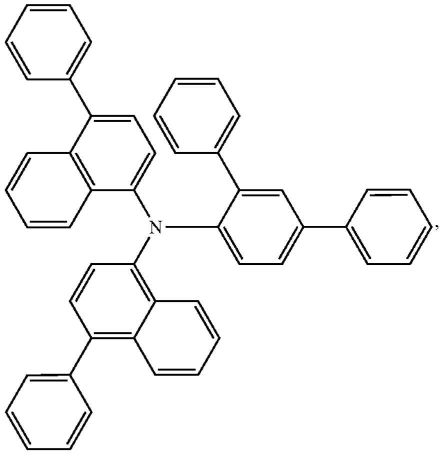

,

HT-4

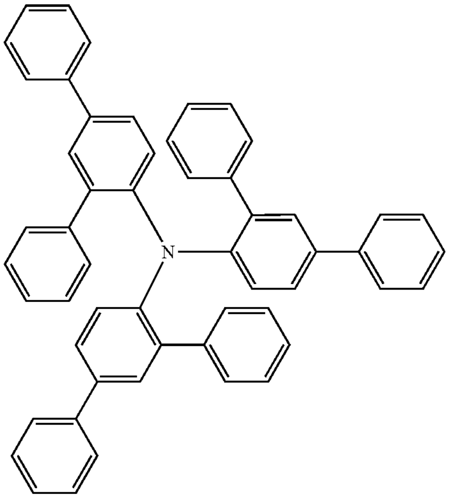

,

-continued
HT-5
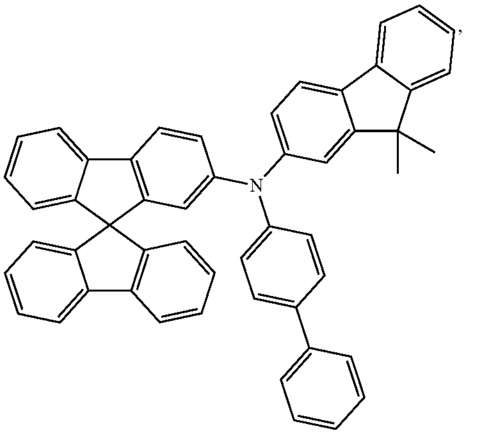
HT-6
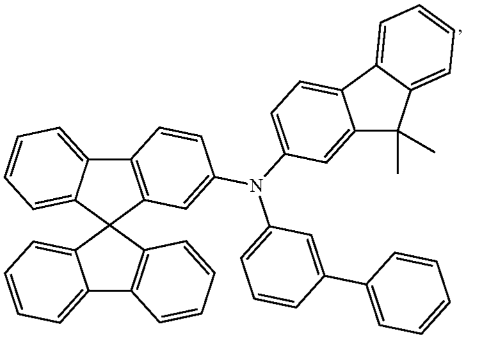
HT-7
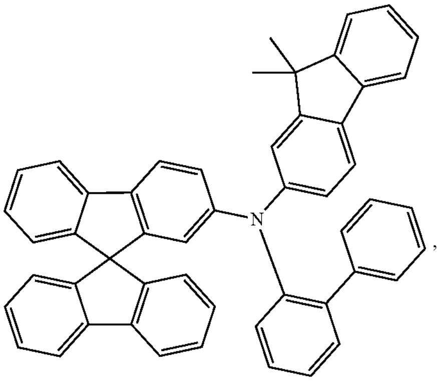
HT-8
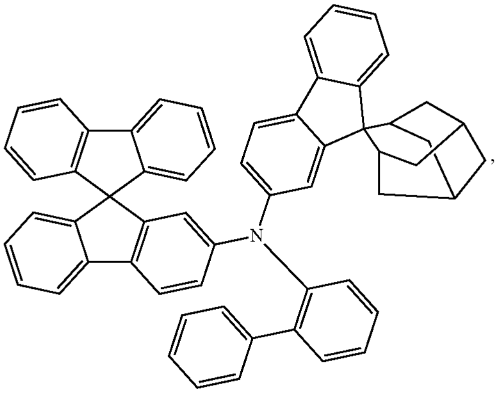
-continued
HT-9
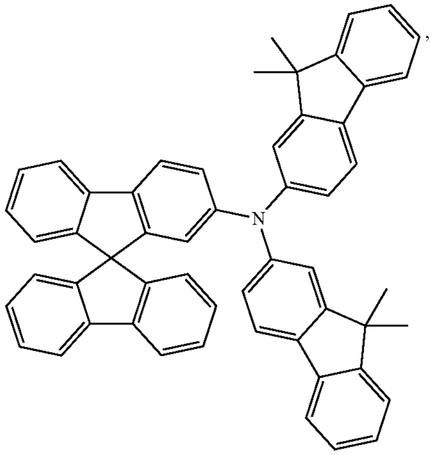
HT-10
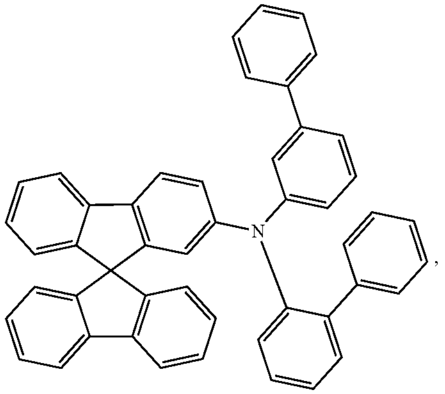
HT-11
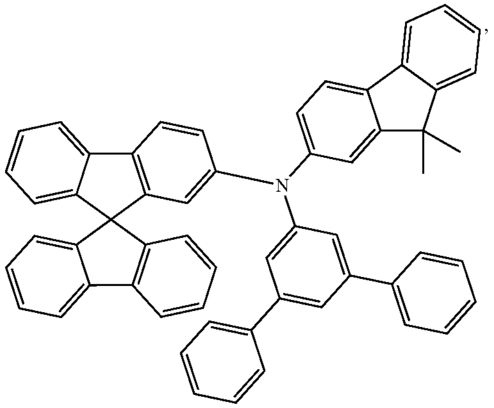

-continued
HT-12
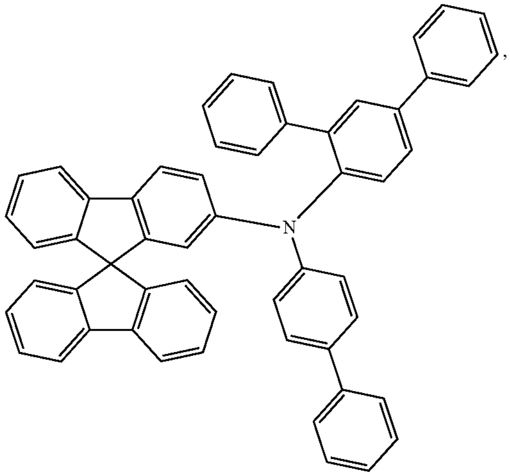,
HT-13
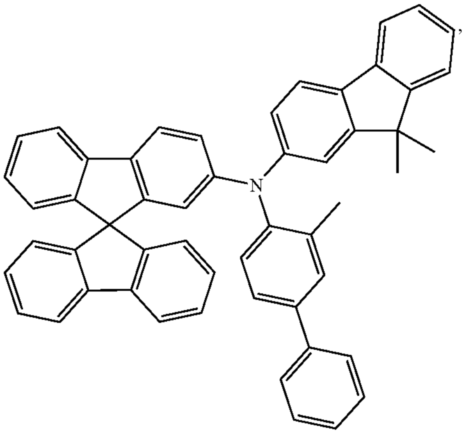,
HT-14
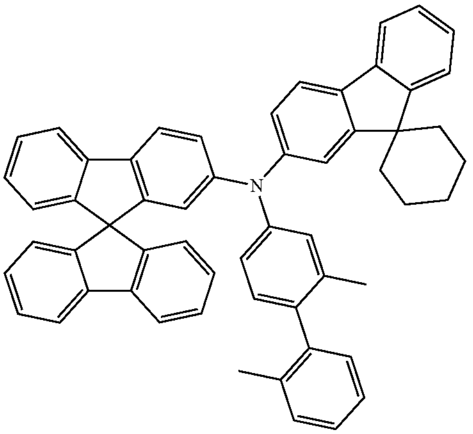,
-continued
HT-15
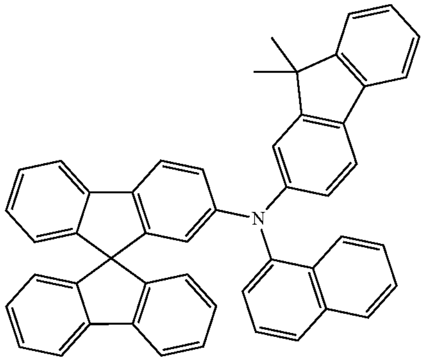,
HT-16
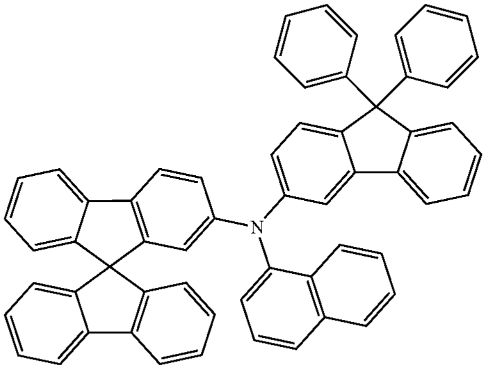,
HT-17
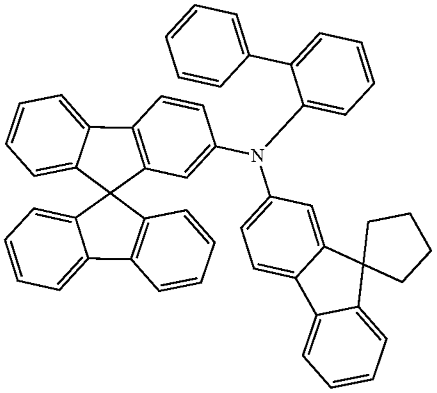,
HT-18
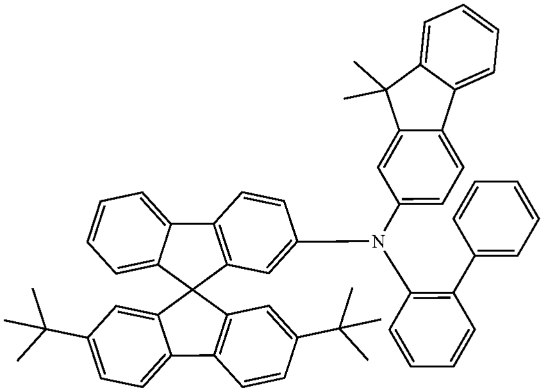, -continued
HT-19
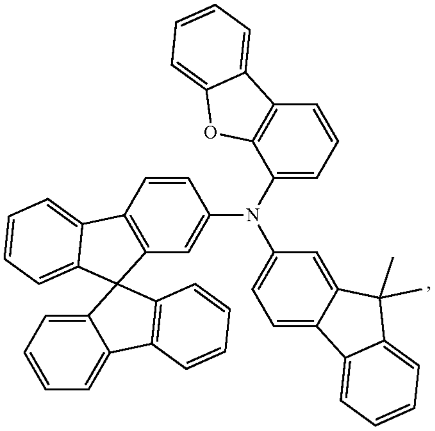
,
HT-20
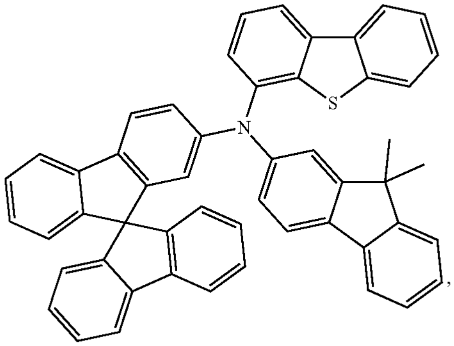
,
HT-21
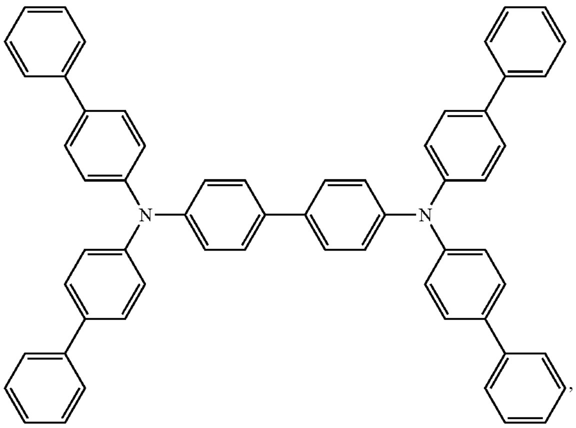
,
HT-22
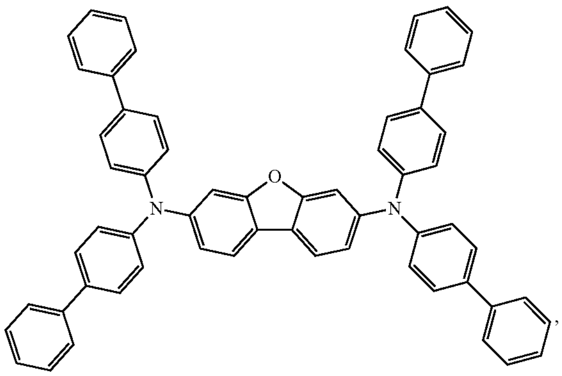
,
-continued
HT-23
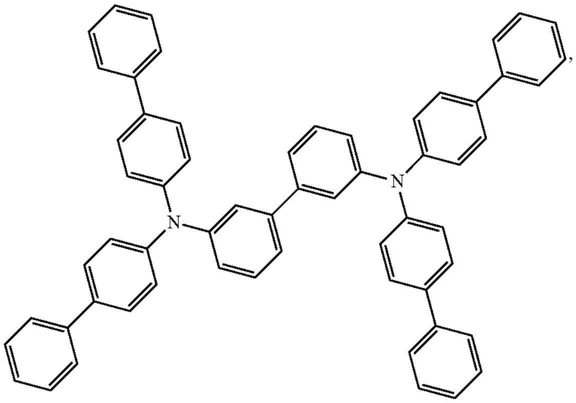
,
HT-24
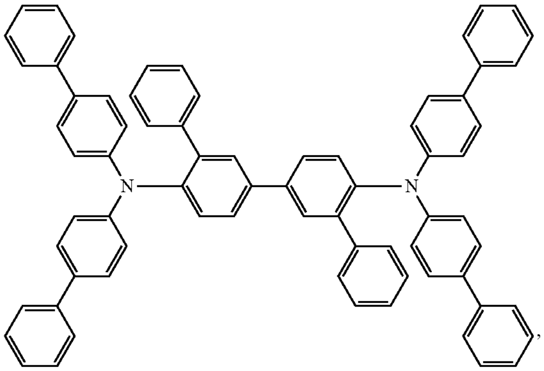
,
HT-25
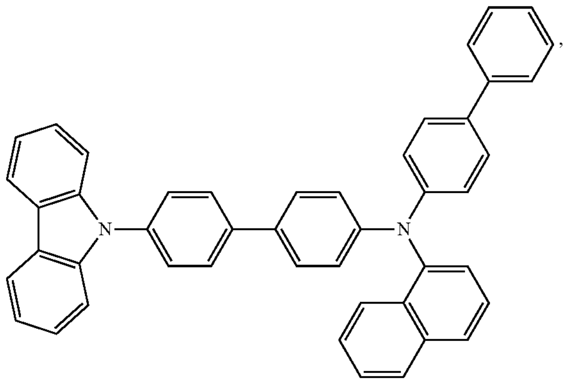
, -continued
HT-26
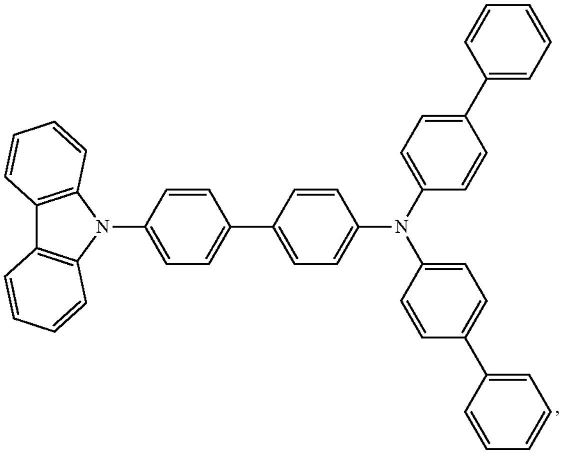
,
HT-27
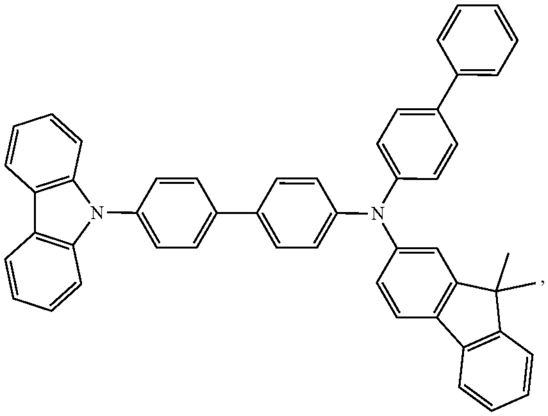
,
HT-28
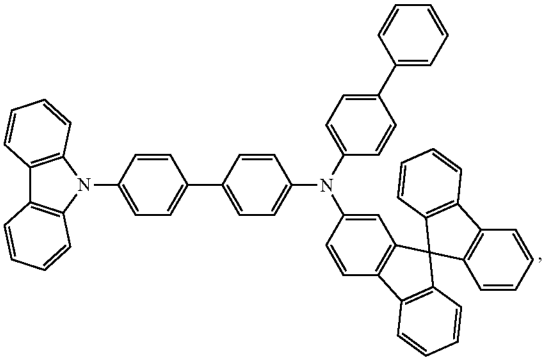
,
HT-29
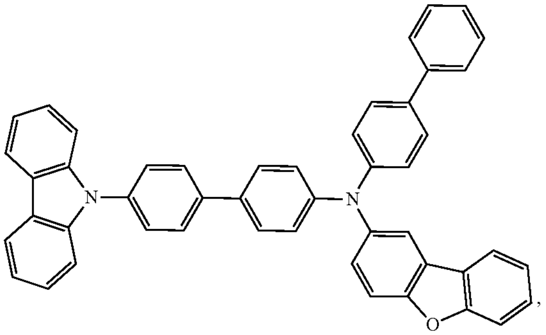
,
-continued
HT-30
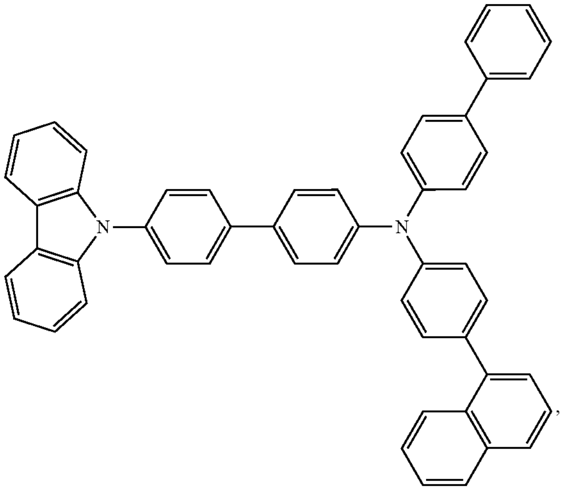
,
HT-31
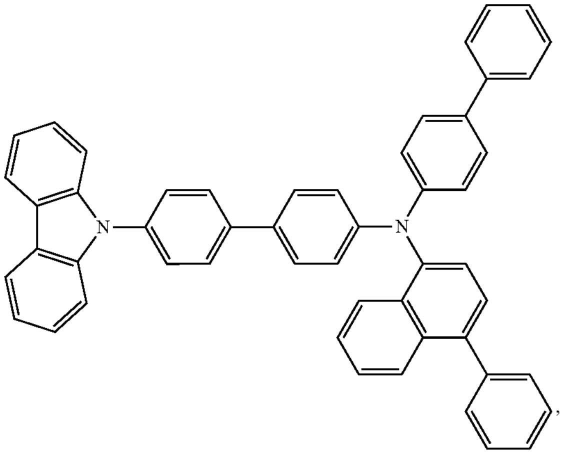
,
HT-32
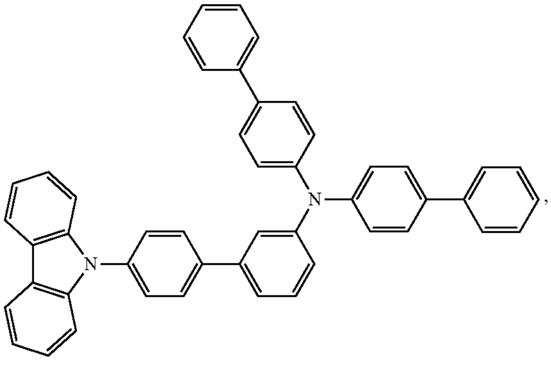
, -continued
HT-33
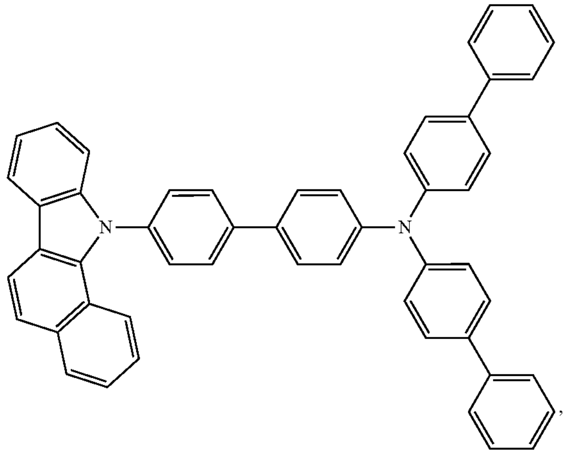
,
HT-34
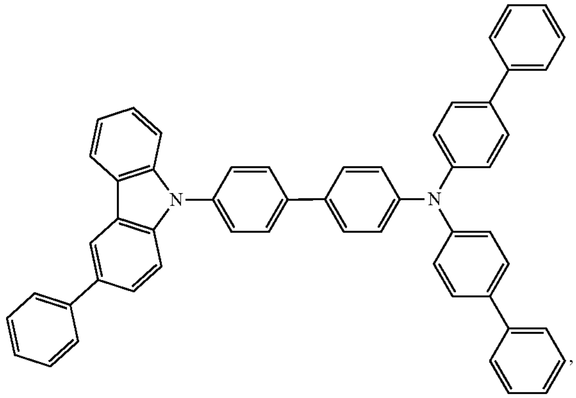
,
HT-35
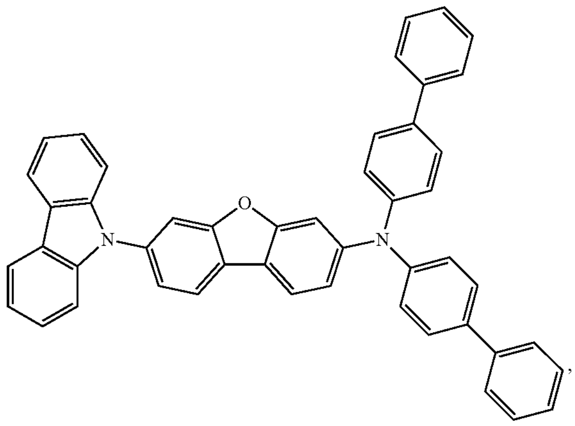
,
-continued
HT-36
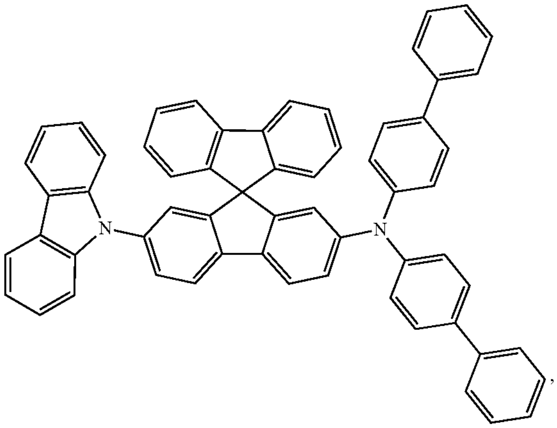
,
HT-37
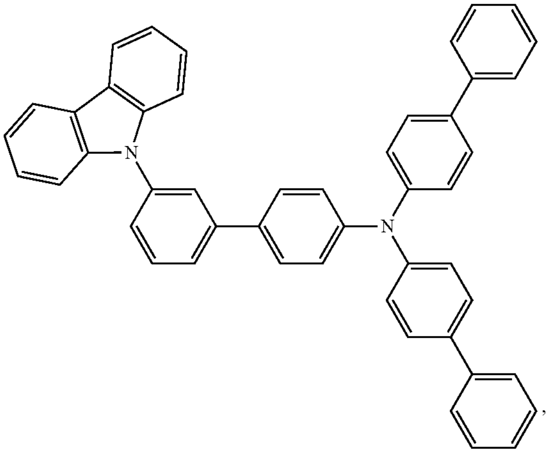
,
HT-38
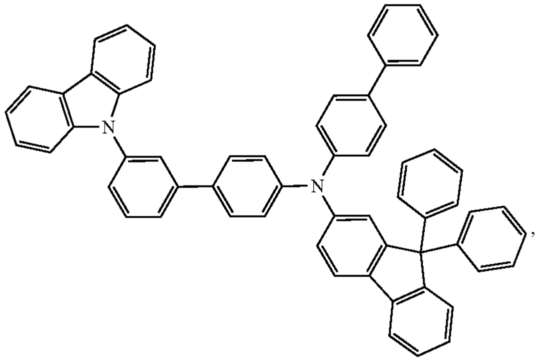
, -continued
HT-39
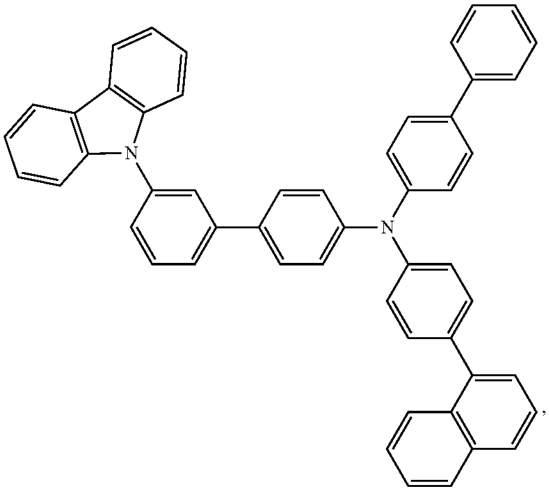
,
HT-40
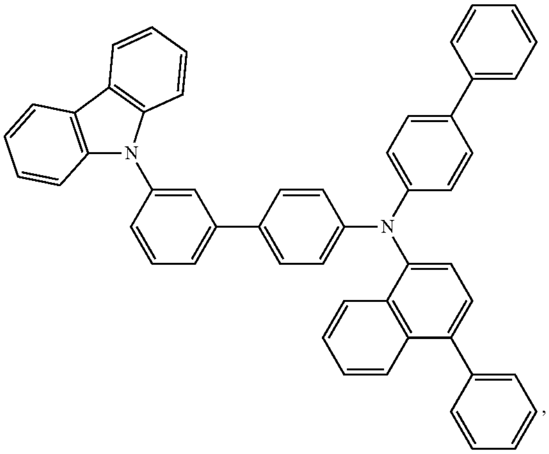
,
HT-41
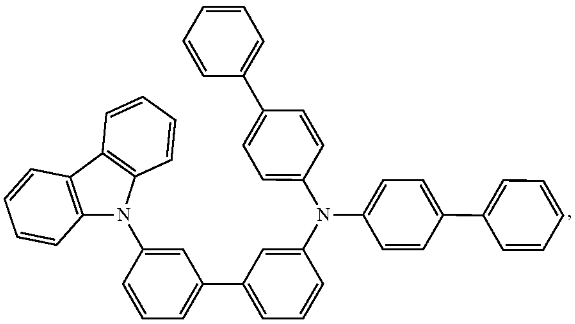
,
-continued
HT-42
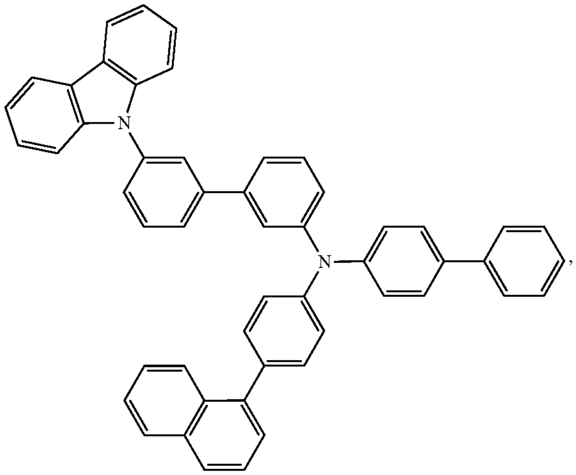
,
HT-43
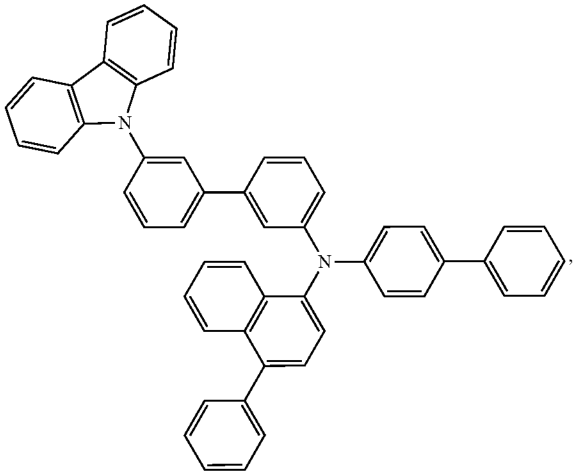
,
HT-44
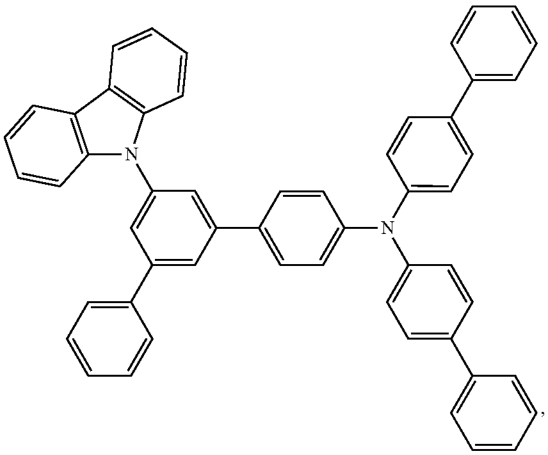
, -continued

HT-45

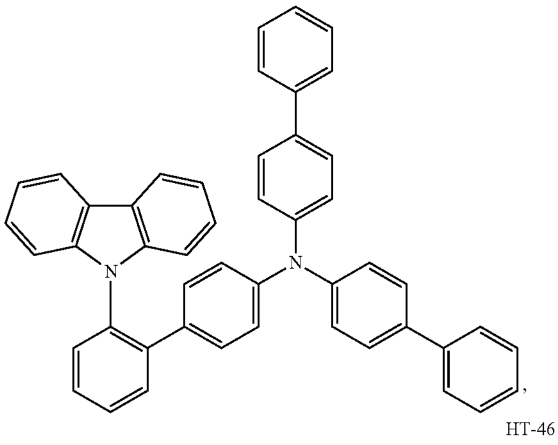,

HT-46

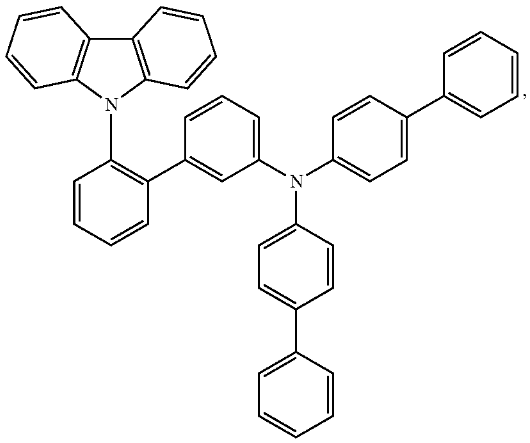, and

HT-47

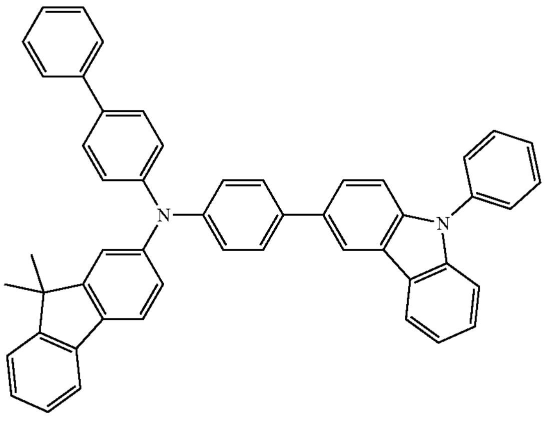.

According to another embodiment of the present disclosure, an electronic assembly is further disclosed. The electronic assembly contains an organic electroluminescent device, wherein the specific structure of the organic electroluminescent device is shown in any one of the preceding embodiments.

According to an embodiment of the present disclosure, the electronic assembly is a display assembly or an illumination assembly.

Herein, the LUMO energy level and the HOMO energy level of the compound are measured by electrochemical cyclic voltammetry. The measurement is conducted using an electrochemical workstation modelled CorrTest CS120 produced by WUHAN CORRTEST INSTRUMENTS CORP., LTD and using a three-electrode working system wherein a platinum disk electrode serves as a working electrode, a $Ag/AgNO_3$ electrode serves as a reference electrode, and a platinum wire electrode serves as an auxiliary electrode. With anhydrous dichloromethane (DCM) as a solvent and 0.1 mol/L tetrabutylammonium hexafluorophosphate as a supporting electrolyte, a target compound is prepared into a solution of $10^{-3}$ mol/L, and nitrogen is introduced into the solution for 10 min for oxygen removal before the measurement. The parameters of the instrument are set as follows: the scan rate is set to 100 mV/s, the potential interval is set to 0.5 mV, and the test window is set to 1 V to −0.5 V. The energy levels of p-type dopants (Compound 4-19, Compound 1-2, Compound 5-1, and Compound 3-1) and the first organic material (HT-18) used in the embodiments of the present application are recorded in Table 1 below, which are measured according to the above measurement method.

TABLE 1

LUMO energy levels of some p-type dopants and HOMO energy level of the organic material

| Compound | Function | LUMO (eV) | HOMO (eV) |
|---|---|---|---|
| 4-19 | p-type dopant | −5.12 | / |
| 1-2 | p-type dopant | −4.63 | / |
| 5-1 | p-type dopant | −5.04 | / |
| 3-1 | p-type dopant | −4.91 | / |
| HT-18 | Hole transporting material | / | −5.13 |

In the current commercial OLED structure, the hole injection layer (HIL) is generally formed by doping two materials (by doping one p-type dopant (PD) into a hole transporting host material (HTM) in a specific proportion), or the HIL may be formed using only one material, for example, using a single material HATCN. When a single PD is doped into the HTM, the hole injection capability can be adjusted only by adjusting the doping proportion of the PD in the HTM. However, when the doping proportion of the PD is such that the PD reaches a certain concentration, the hole injection cannot be further regulated so the capability of the single PD to regulate hole injection is limited.

If two or more PDs are doped into the HTM in one layer of HIL, more space may be provided for adjusting the hole injection capability in a device. For example, since two different PD materials exist in the same HIL layer, in one aspect, PD materials having different LUMOs may be selected to regulate the hole injection capability. In the same HIL, preferably, two PD materials whose LUMO energy level difference is between 0.05 eV and 0.8 eV (that is, 0.05 eV$\le|LUMO_{first\ p\text{-}type\ dopant}-LUMO_{second\ p\text{-}type\ dopant}|\le$0.8 eV) are selected, and more preferably, two PD materials whose LUMO energy level difference is between 0.1 eV and 0.5 eV (that is, 0.1 eV$\le|LUMO_{first\ p\text{-}type\ dopant}-LUMO_{second\ p\text{-}type\ dopant}|\le$0.5 eV) are selected, to achieve more effective adjustment on hole injection of the HIL. For example, the LUMO energy level difference (absolute value) between Compound 4-19 and Compound 1-2 reaches 0.49 eV. When Compound 4-19 and Compound 1-2 jointly serve as the two PD materials of the HIL layer in Device Example 1-1 below, compared with Device Comparative Example 1-3 and Device Comparative Example 1-1 where Compound 1-2 or Compound 4-19 serves as the PD material of the HIL layer alone, it can be seen that Device Example 1-1 achieves the great reduction in voltages and the significant improvement in lifetimes. In another aspect, the regulation of the hole injection capability may also be achieved by simultaneously regulating the doping proportions of two PD materials in the HIL layer. The preceding adjustment manners balance carriers in the device and greatly improve the comprehensive performance of the device, which cannot be achieved when the HIL layer contains only one PD material.

The present application provides a new organic electroluminescent device, wherein the hole transporting region of the organic electroluminescent device contains a specific first organic layer, the first organic layer contains a first p-type dopant and a second p-type dopant, the first p-type dopant is different from the second p-type dopant. The new organic electroluminescent device has a significant effect on the improvement of the comprehensive performance of the device.

Combination with Other Materials

The materials described in the present disclosure for a particular layer in an organic light-emitting device can be used in combination with various other materials present in the device. The combinations of these materials are described in more detail in U.S. Pat. App. Pub. No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light-emitting device may be used in combination with a variety of other materials present in the device. For example, dopants disclosed herein may be used in combination with a wide variety of hosts, transporting layers, blocking layers, injection layers, electrodes and other layers that may be present. The combination of these materials is described in detail in paragraphs 0080-0101 of U.S. Pat. App. Pub. No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well-known to the persons skilled in the art. As the persons skilled in the art are aware of the above-mentioned equipment use, test methods and other related contents, the inherent data of the sample can be obtained with certainty and without influence, so the above related contents are not further described in this patent.

The working principle of the organic electroluminescent device of the present disclosure is specifically described below through several device examples. Apparently, the following examples are only for the purpose of illustration and are not intended to limit the scope of the present disclosure. Based on the following examples, the persons skilled in the art can obtain other examples of the present disclosure by conducting improvements on these examples.

Device Example 1-1

Figure 3:
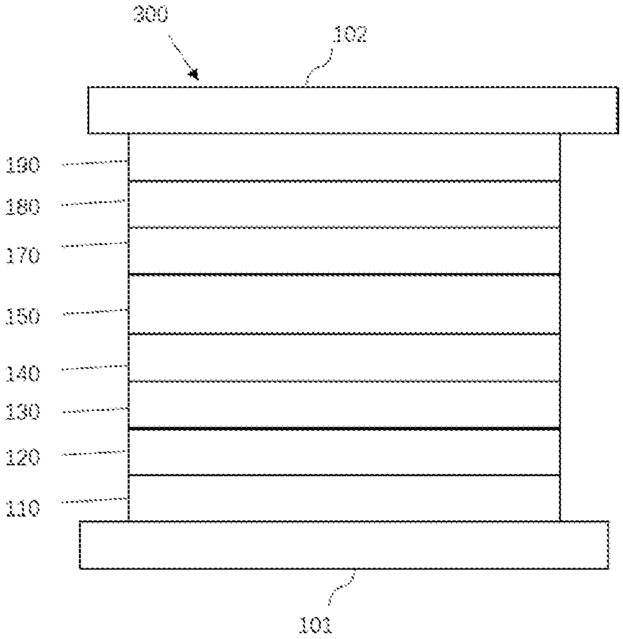
FIG. 3 is a structure diagram of an organic electroluminescent device 300 according to the present disclosure.

An organic electroluminescent device 300 shown in FIG. 3 was prepared. The implementation of Example 1-1 is described below. First, a glass substrate 101 having an indium tin oxide (ITO) anode 110 with a thickness of 1200 Å was cleaned, subjected to plasma processing using UV ozone and oxygen, dried in a nitrogen-filled glovebox to remove moisture, mounted on a substrate holder, and placed in a vacuum chamber. Organic layers were sequentially deposited by vacuum thermal evaporation on the ITO anode at a rate of 0.01 Å/s to 10 Å/s and at a vacuum degree of about $10^{-6}$ Torr. Compound HT-18, Compound 4-19, and Compound 1-2 were co-deposited as a first organic layer 120 (that is, an HIL) (100 Å), wherein the mass ratio of Compound HT-18, Compound 4-19 to Compound 1-2 was 83.5:0.5:16. Compound HT-18 was deposited as a hole transporting layer (HTL) 130 (400 Å). Compound EB was deposited as an electron blocking layer (EBL) 140 (50 Å). Host compound RH was doped with a red light-emitting dopant Compound D-1 to form a red emissive layer (EML) 150 (400 Å), wherein the mass ratio of Compound D-1 to Host compound RH was 3:97. Compound ET and 8-hydroxyquinolinolato-lithium (Liq) were co-deposited as an electron transporting layer (ETL) 170 (350 Å), wherein the mass ratio of Compound ET to Liq was 40:60. On the ETL, Liq was deposited as an electron injection layer (EIL) 180 with a thickness of 10 Å. Finally, A1 was deposited as a cathode 190 with a thickness of 1200 Å. After evaporation, the device was transferred back to the glovebox and encapsulated with a glass lid 102 to complete the device.

Example 1-2

The preparation process of Example 1-2 was the same as the preparation process of Example 1-1 except that the mass ratio of Compound HT-18, Compound 4-19 to Compound 1-2 in the HIL was 89:1:10.

Example 1-3

The preparation process of Example 1-3 was the same as the preparation process of Example 1-1 except that the mass ratio of Compound HT-18, Compound 4-19 to Compound 1-2 in the HIL was 83:1:16.

Example 1-4

The preparation process of Example 1-4 was the same as the preparation process of Example 1-1 except that Compound 4-19 in the HIL was replaced with Compound 5-1 and the mass ratio of Compound HT-18, Compound 5-1 to Compound 1-2 was 89.5:0.5:10.

Example 1-5

The preparation process of Example 1-5 was the same as the preparation process of Example 1-4 except that the mass ratio of Compound HT-18, Compound 5-1 to Compound 1-2 in the HIL was 83.5:0.5:16.

Comparative Example 1-1

The preparation process of Comparative Example 1-1 was the same as the preparation process of Example 1-1 except that the dopant in the HIL only contained Compound 4-19 and the mass ratio of Compound HT-18 to Compound 4-19 was 99.5:0.5.

Comparative Example 1-2

The preparation process of Comparative Example 1-2 was the same as the preparation process of Comparative Example 1-1 except that the mass ratio of Compound HT-18 to Compound 4-19 in the HIL was 99:1.

Comparative Example 1-3

The preparation process of Comparative Example 1-3 was the same as the preparation process of Comparative Example 1-1 except that the dopant in the HIL only contained Compound 1-2 and the mass ratio of Compound HT-18 to Compound 1-2 was 84:16.

Comparative Example 1-4

The preparation process of Comparative Example 1-4 was the same as the preparation process of Comparative Example 1-3 except that the mass ratio of Compound HT-18 to Compound 1-2 in the HIL was 90:10.

Comparative Example 1-5

The preparation process of Comparative Example 1-5 was the same as the preparation process of Comparative Example 1-1 except that the dopant in the HIL only contained Compound 5-1 and the mass ratio of Compound HT-18 to Compound 5-1 was 99.5:0.5.

Detailed structures and thicknesses of part of organic layers of the devices are shown in Table 2 below. The layers using more than one material were obtained by doping different compounds at their mass ratios as recorded. It is to be noted that the above device structures are only for the purposes of example, and the present disclosure is not limited to the specific examples listed above.

TABLE 2

Part of device structures in Examples 1-1 to 1-5 and Comparative Examples 1-1 to 1-5

| Device No. | First organic layer (HIL) | HTL |
|---|---|---|
| Example 1-1 | HT-18:Compound 4-19:Compound 1-2 (83.5:0.5:16) (100 Å) | HT-18 (400 Å) |
| Example 1-2 | HT-18:Compound 4-19:Compound 1-2 (89:1:10) (100 Å) | HT-18 (400 Å) |
| Example 1-3 | HT-18:Compound 4-19:Compound 1-2 (83:1:16) (100 Å) | HT-18 (400 Å) |
| Example 1-4 | HT-18:Compound 5-1:Compound 1-2 (89.5:0.5:10) (100 Å) | HT-18 (400 Å) |
| Example 1-5 | HT-18:Compound 5-1:Compound 1-2 (83.5:0.5:16) (100 Å) | HT-18 (400 Å) |
| Comparative Example 1-1 | HT-18:Compound 4-19 (99.5:0.5) (100 Å) | HT-18 (400 Å) |
| Comparative Example 1-2 | HT-18:Compound 4-19 (99:1) (100 Å) | HT-18 (400 Å) |
| Comparative Example 1-3 | HT-18:Compound 1-2 (84:16) (100 Å) | HT-18 (400 Å) |
| Comparative Example 1-4 | HT-18:Compound 1-2 (90:10) (100 Å) | HT-18 (400 Å) |
| Comparative Example 1-5 | HT-18:Compound 5-1 (99.5:0.5) (100 Å) | HT-18 (400 Å) |

The structures of the compounds used in the devices are shown as follows:

HT-18

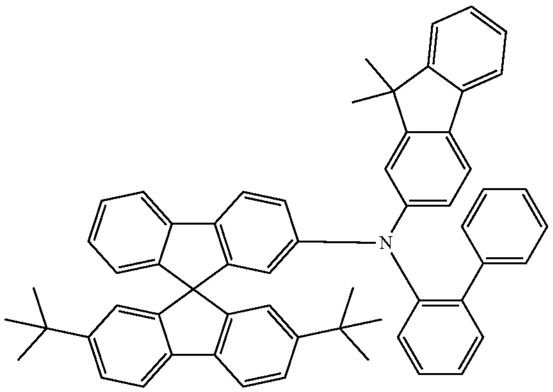

4-19

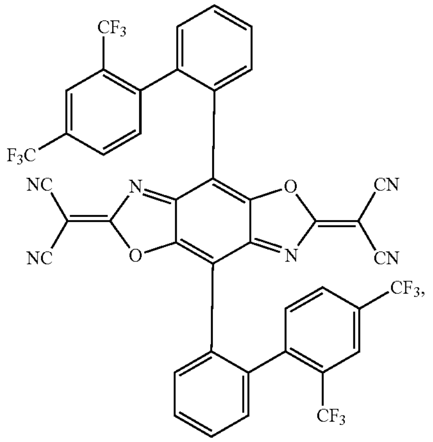

1-2

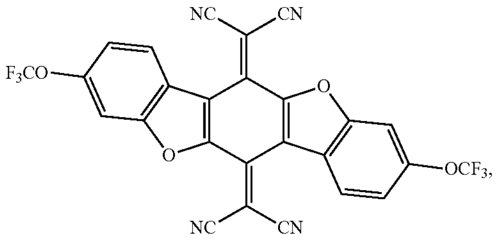

5-1

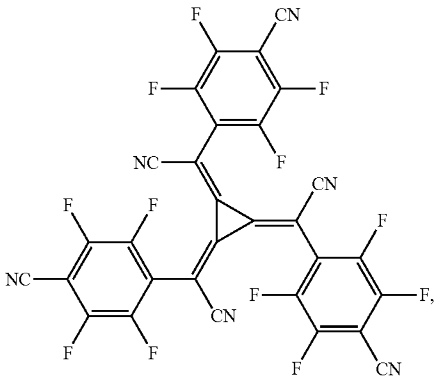

-continued

EB

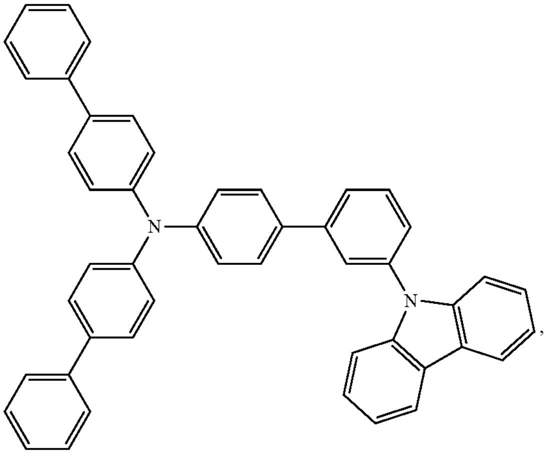

RH

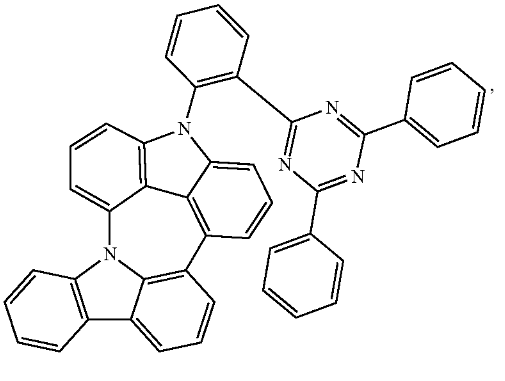

D-1

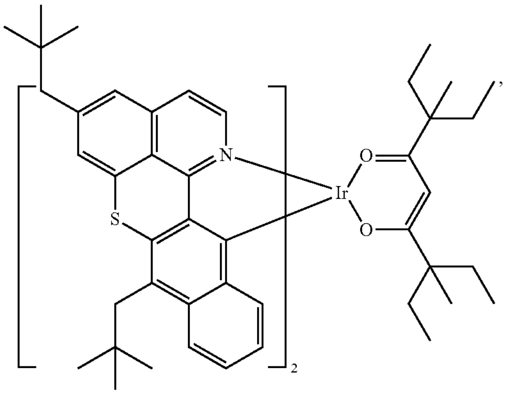

-continued

ET

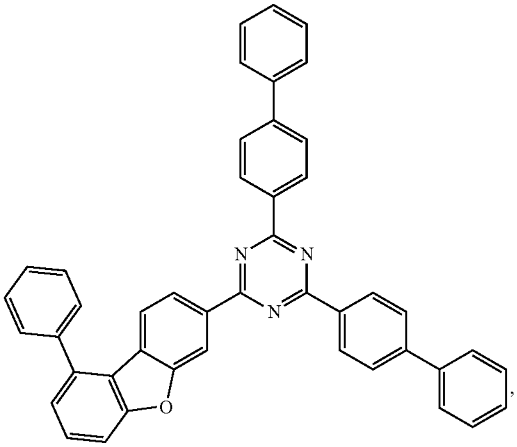

, and

Liq

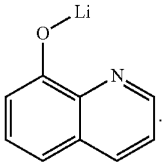

The performance of the devices in Examples 1-1 to 1-5 and Comparative Examples 1-1 to 1-5 is listed in Table 3, wherein the chromaticity coordinates (CIE), voltage, and external quantum efficiency (EQE) were measured at a current density of 10 mA/cm$^2$, and the device lifetime (LT97) was the time measured for the brightness to decay to 97% of the initial brightness at the drive of a constant current of 80 mA/cm$^2$.

TABLE 3

Device data in Examples 1-1 to 1-5 and Comparative Examples 1-1 to 1-5

| Device No. | 10 mA/cm$^2$ CIE (x, y) | Voltage (V) | EQE (%) | 80 mA/cm$^2$ LT97 (h) |
|---|---|---|---|---|
| Example 1-1 | (0.701, 0.299) | 3.0 | 28.8 | 209 |
| Example 1-2 | (0.701, 0.298) | 2.9 | 27.5 | 225 |
| Example 1-3 | (0.701, 0.298) | 3.0 | 26.6 | 235 |
| Example 1-4 | (0.700, 0.299) | 2.9 | 27.4 | 197 |
| Example 1-5 | (0.700, 0.299) | 2.9 | 26.6 | 244 |
| Comparative Example 1-1 | (0.701, 0.298) | 3.8 | 29.9 | 116 |
| Comparative Example 1-2 | (0.701, 0.298) | 3.1 | 26.8 | 120 |
| Comparative Example 1-3 | (0.701, 0.298) | 3.5 | 33.6 | 107 |
| Comparative Example 1-4 | (0.700, 0.299) | 4.1 | 35.9 | 27 |
| Comparative Example 1-5 | (0.701, 0.299) | 3.1 | 26.8 | 92 |

Although high EQE, low voltage, and long lifetime are widely desired in the field of OLEDs, the comprehensive performance of the device should be considered when the preceding desired performance cannot be satisfied simultaneously. If a device has a high EQE but a high voltage, such a device is still not commercially available. For example, in Table 3, although the device in Comparative Example 1-4 had an EQE as high as 35.9%, but and its voltage was as high as 4.1 V at 10 $mA/cm^2$, its lifetime was only 27 h. The device in Example 1-5 had an EQE of 26.6% which is lower than the EQE of the device in Comparative Example 1-5 but is still considered as a very high level in the industry, while its voltage was only 2.9 V, and its lifetime was as long as 244 h. As can be seen, the device in Example 1-5 is an OLED device having excellent comprehensive performance, while the device in Comparative Example 1-4 does not show the device performance desired in the industry.

As can be seen from the chromaticity coordinates, the chromaticity coordinates of the devices in Examples 1-1 to 1-5 were basically consistent with the chromaticity coordinates of the devices in Comparative Examples 1-1 to 1-5.

In Example 1-1, Compound HT-18 was used as the first organic material, two p-type dopants Compound 4-19 and Compound 1-2 were used as the doped material, and the three materials were co-deposited at a mass ratio (doping ratio) of 83.5:0.5:16 as the first organic layer, that is, the HIL. As can be seen from the data in Table 3, the device in Example 1-1 obtained a low voltage of 3.0 V, a high EQE of 28.8%, and a long lifetime of 209 h. Compared with the performance of the device in Comparative Example 1-1 in which Compound 4-19 was used as the p-type dopant alone, the voltage of the device in Example 1-1 was greatly reduced by 0.8 V, and the lifetime was increased by 80%. Compared with the performance of the device in Comparative Example 1-3 in which Compound 1-2 was used as the p-type dopant alone in the HIL, the voltage of the device in Example 1-1 was reduced by 0.5 V, the lifetime was increased by 95%, and the EQE of the device in Example 1-1 reached a high level of 28.8%. Therefore, it is considered that the comprehensive performance of the device in Example 1-1 is extremely excellent. As shown by the preceding data, compared with the use of only one p-type dopant, the use of two different p-type dopants in the HIL achieves more excellent comprehensive performance of the device and especially, achieves the great reduction in voltages and the significant improvement in lifetimes. It also indicates that the use of two different p-type dopants in the HIL plays a key role in the improvement of the comprehensive performance of the device.

In Example 1-2, Compound HT-18 was used as the first organic material, two p-type dopants Compound 4-19 and Compound 1-2 were used as the doped material, and the three materials were co-deposited at a mass ratio of 89:1:10 as the first organic layer, that is, the HIL. As can be seen from the data in Table 3, the device in Example 1-2 obtained an ultra-low voltage of 2.9 V, a high EQE of 27.5%, and a long lifetime of 225 h. Compared with the performance of the device in Comparative Example 1-2 in which Compound 4-19 was used as the p-type dopant alone, the voltage of the device in Example 1-2 was reduced by 0.2 V, the lifetime was increased by 87.5%, and the EQE was slightly improved. Similarly, compared with the performance of the device in Comparative Example 1-4 in which Compound 1-2 was used as the p-type dopant alone in the HIL, the voltage of the device in Example 1-2 is greatly reduced by 1.2 V, the lifetime was significantly increased by 7.3 times, and the EQE of the device in Example 1-2 reached a high level of 27.5%. Therefore, it is considered that the comprehensive performance of the device in Example 1-2 is extremely excellent. As shown by the preceding data, compared with the use of only one p-type dopant, the use of two different p-type dopants in the HIL achieves more excellent comprehensive performance of the device and especially, achieves the great reduction in voltages and the significant improvement in lifetimes. It also indicates that the use of two different p-type dopants in the HIL plays a key role in the improvement of the comprehensive performance of the device.

In Example 1-3, Compound HT-18 was used as the first organic material, two p-type dopants Compound 4-19 and Compound 1-2 were used as the doped material, and the three materials were co-deposited at a mass ratio of 83:1:16 as the first organic layer, that is, the HIL. As can be seen from the data in Table 3, the device in Example 1-3 obtained a low voltage of 3.0 V, a high EQE of 26.6%, and a long lifetime of 235 h. Compared with the performance of the device in Comparative Example 1-2 in which Compound 4-19 was used as the p-type dopant alone, the voltage of the device in Example 1-3 was greatly reduced by 0.1 V, and the lifetime was increased by 95.8%. Similarly, compared with the performance of the device in Comparative Example 1-3 in which Compound 1-2 was used as the p-type dopant alone in the HIL, the voltage of the device in Example 1-3 was reduced by 0.5 V, the lifetime was greatly increased by about 1.2 times, and the EQE of the device in Example 1-3 reached a high level of 26.6%. Therefore, it is considered that the comprehensive performance of the device in Example 1-3 is extremely excellent. As shown by the preceding data, compared with the use of only one p-type dopant, the use of two different p-type dopants in the HIL achieves more excellent comprehensive performance of the device and especially, achieves the great reduction in voltages and the significant improvement in lifetimes. It also indicates that the use of two different p-type dopants in the HIL plays a key role in the improvement of the comprehensive performance of the device.

In Example 1-4, Compound HT-18 was used as the first organic material, two p-type dopants Compound 5-1 and Compound 1-2 were used as the doped material, and the three materials were co-deposited at a mass ratio of 89.5:0.5:10 as the first organic layer, that is, the HIL. As can be seen from the data in Table 3, the device in Example 1-4 obtained an ultra-low voltage of 2.9 V, a high EQE of 27.4%, and a long lifetime of 197 h. Compared with the performance of the device in Comparative Example 1-5 in which Compound 5-1 was used as the p-type dopant alone, the voltage of the device in Example 1-4 was reduced by 0.2 V, the lifetime was increased by about 1.1 times, and the EQE was slightly improved. Similarly, compared with the performance of the device in Comparative Example 1-4 in which Compound 1-2 was used as the p-type dopant alone in the HIL, the voltage of the device in Example 1-4 was greatly reduced by 1.2 V, the lifetime was significantly increased by about 6.3 times, and the EQE of the device in Example 1-4 reached a high level of 27.4%. Therefore, it is considered that the comprehensive performance of the device in Example 1-4 is extremely excellent. As shown by the preceding data, compared with the use of only one p-type dopant, the use of two different p-type dopants in the HIL achieves more excellent comprehensive performance of the device and especially, achieves the great reduction in voltages and the significant improvement in lifetimes. It also indicates that the use of two different p-type dopants in the HIL plays a key role in the improvement of the comprehensive performance of the device.

In Example 1-5, Compound HT-18 was used as the first organic material, two p-type dopants Compound 5-1 and Compound 1-2 were used as the doped material, and the three materials were co-deposited at a mass ratio of 83.5:0.5:16 as the first organic layer, that is, the HIL. As can be seen from the data in Table 3, the device in Example 1-5 obtained an ultra-low voltage of 2.9 V, a high EQE of 26.6%, and a long lifetime of 244 h. Compared with the performance of the device in Comparative Example 1-5 in which Compound 5-1 was used as the p-type dopant alone, the voltage of the device in Example 1-5 was reduced by 0.2 V, the lifetime was increased by about 1.7 times, and the EQE was basically equivalent. Similarly, compared with the performance of the device in Comparative Example 1-3 in which Compound 1-2 was used as the p-type dopant alone in the HIL, the voltage of the device in Example 1-5 was reduced by 0.6 V, the lifetime was greatly increased by about 1.3 times, and the EQE of the device in Example 1-5 reached a high level of 26.6%. Therefore, it is considered that the comprehensive performance of the device in Example 1-5 is extremely excellent. As shown by the preceding data, compared with the use of only one p-type dopant, the use of two different p-type dopants in the HIL achieves more excellent comprehensive performance of the device and especially, achieves the great reduction in voltages and the significant improvement in lifetimes. It also indicates that the use of two different p-type dopants in the HIL plays a key role in the improvement of the comprehensive performance of the device.

Example 2-1

An organic electroluminescent device 200 shown in FIG. 2 was prepared. The implementation of Example 2-1 is described below. First, a glass substrate 101 having an indium tin oxide (ITO) anode 110 with a thickness of 800 Å was cleaned, subjected to plasma processing using UV ozone and oxygen, dried in a nitrogen-filled glovebox to remove moisture, mounted on a substrate holder, and placed in a vacuum chamber. Organic layers were sequentially deposited by vacuum thermal evaporation on the ITO anode 110 at a rate of 0.01 Å/s to 10 Å/s and at a vacuum degree of about $10^{-6}$ Torr. First, Compound HT-18, Compound 1-2, and Compound 3-1 were co-deposited as a first organic layer 120 (that is, an HIL) (100 Å), wherein the mass ratio of Compound HT-18, Compound 1-2, and Compound 3-1 was 87:12:1. Compound HT-18 was deposited as a hole transporting layer (HTL) 130 with a thickness of 250 Å. Compound EB1 was deposited as an electron blocking layer (EBL) 140 (50 Å). Blue light host compound BH was doped with a blue light-emitting dopant Compound D-2 to be co-deposited as a blue emissive layer (EML) 150 (250 Å), wherein the mass ratio of Compound D-2 to Blue light host compound BH was 2:98. Compound HB was deposited as a hole blocking layer (HBL) 160 (50 Å). On the HBL, Compound ET and Liq were co-deposited as an electron transporting layer (ETL) 170 (300 Å), wherein the mass ratio of Compound ET to Liq was 40:60. On the ETL, Liq was deposited as an electron injection layer (EIL) 180 with a thickness of 10 Å. Finally, Al was deposited as a cathode 190 with a thickness of 1200 Å. After evaporation, the device was transferred back to the glovebox and encapsulated with a glass lid 102 to complete the device.

Comparative Example 2-1

The preparation process of Comparative Example 2-1 was the same as the preparation process of Example 2-1 except that the dopant in the HIL only contained Compound 1-2 and the mass ratio of Compound HT-18 to Compound 1-2 was 88:12.

Comparative Example 2-2

The preparation process of Comparative Example 2-2 was the same as the preparation process of Example 2-1 except that the dopant in the HIL only contained Compound 3-1 and the mass ratio of Compound HT-18 to Compound 3-1 was 99:1.

Detailed structures and thicknesses of part of organic layers of the devices are shown in Table 4 below. The layers using more than one material were obtained by doping different compounds at their mass ratios as recorded.

TABLE 4

Part of device structures in Example 2-1 and Comparative Examples 2-1 and 2-2

| Device No. | First organic layer (HIL) | HTL |
|---|---|---|
| Example 2-1 | HT-18:Compound 1-2:Compound 3-1 (87:12:1) (100 Å) | HT-18 (250 Å) |
| Comparative Example 2-1 | HT-18:Compound 1-2 (88:12) (100 Å) | HT-18 (250 Å) |
| Comparative Example 2-2 | HT-18:Compound 3-1 (99:1) (100 Å) | HT-18 (250 Å) |

The structures of the new compounds used in the device are shown as follows:

3-1

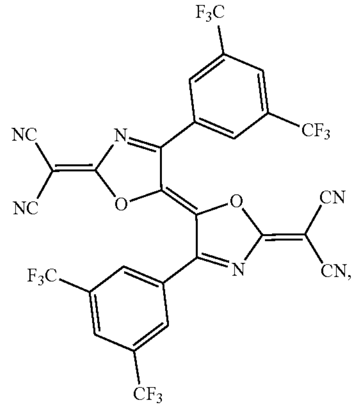

BH

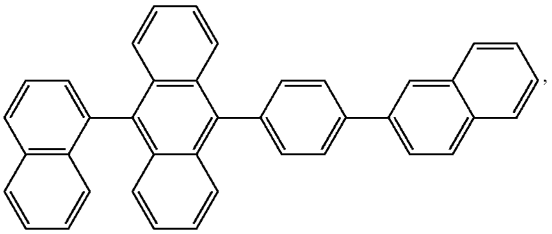

D-2

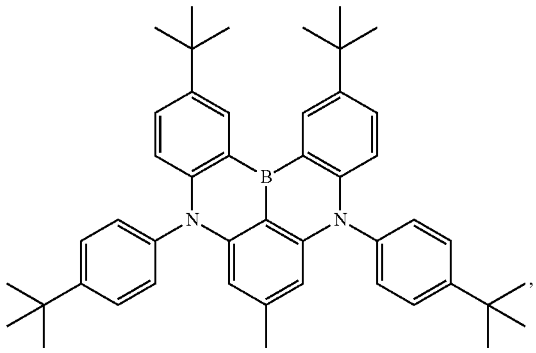

-continued

EB1

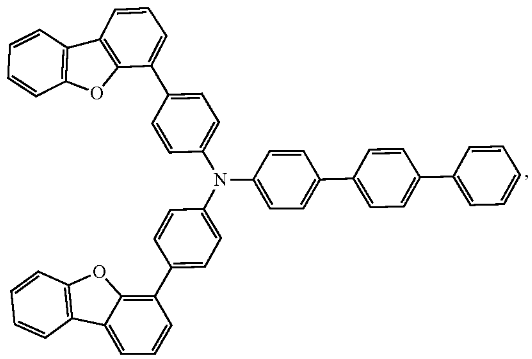

, and

HB

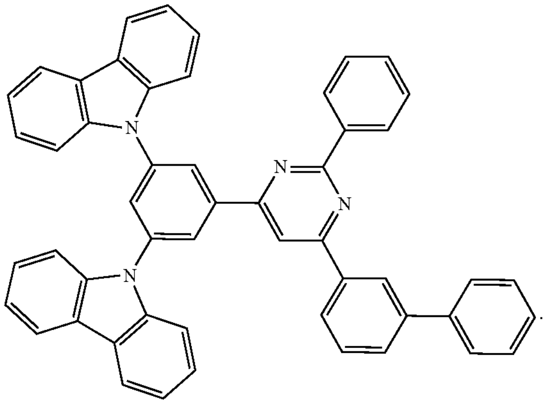

.

The performance of the devices in Example 2-1 and Comparative Examples 2-1 and 2-2 is listed in Table 5, wherein the chromaticity coordinates (CIE), voltage, and external quantum efficiency (EQE) were measured at a current density of 10 mA/$cm^2$, and the device lifetime (LT97) was the time measured for the brightness to decay to 97% of the initial brightness at the drive of a constant current of 80 mA/$cm^2$.

TABLE 5

Device performance in Example 2-1 and Comparative Examples 2-1 to 2-2

| | 10 mA/$cm^2$ | | | |
|---|---|---|---|---|
| Device No. | CIE (x, y) | Voltage (V) | EQE (%) | 80 mA/$cm^2$ LT97 (h) |
| Example 2-1 | (0.130, 0.089) | 4.0 | 8.7 | 65 |
| Comparative Example 2-1 | (0.132, 0.085) | 4.7 | 10.5 | 0.5 |
| Comparative Example 2-2 | (0.131, 0.085) | 4.2 | 9.3 | 29 |

In Example 2-1, Compound HT-18 was used as the first organic material, two p-type dopants Compound 2-1 and Compound 3-1 were used as the doped material, and the three materials were co-deposited at a mass ratio of 87:12:1 as the first organic layer, that is, the HIL. As can be seen from the data in Table 5, Compared with the performance of the device in Comparative Example 2-1 in which Compound 1-2 was used as the p-type dopant alone, the voltage of the device in Example 2-1 was reduced by 0.7 V, and the lifetime was increased by about 129 times. Similarly, compared with the performance of the device in Comparative Example 2-2 in which Compound 3-1 was used as the p-type dopant alone in the HIL, the voltage of the device in Example 2-1 was reduced by 0.2 V, the lifetime was significantly increased by about 1.2 times, and the EQE of the device in Example 2-1 reached 8.7%, which is a relatively high efficiency level in the blue fluorescent system. To sum up, it is considered that the comprehensive performance of the device in Example 2-1 is extremely excellent. As shown by the preceding data, compared with the use of only one p-type dopant, the use of two different p-type dopants in the first organic layer of the hole transporting region achieves more excellent comprehensive performance of the device and especially, achieves the great reduction in voltages and the significant improvement in lifetimes. It indicates that the use of two different p-type dopants in the first organic layer plays a key role in the improvement of the comprehensive performance of the device.

Example 3-1 Preparation of a Stacked Blue Fluorescent Device

Figure 4:
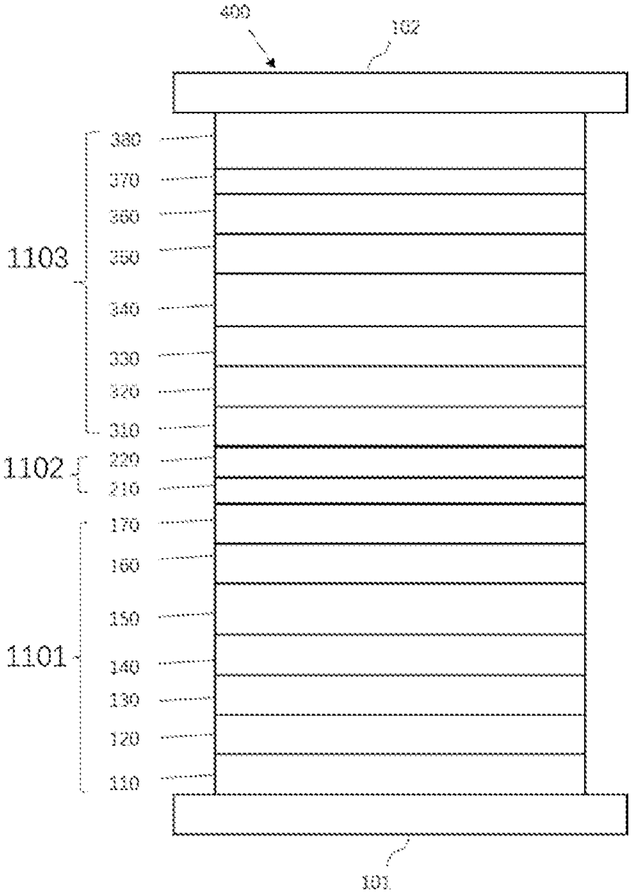
FIG. 4 is a structure diagram of a tandem organic electroluminescent device 400 according to the present disclosure.

A tandem organic electroluminescent device 400 shown in FIG. 4 was prepared. The implementation of Example 3-1 is described below. First, a glass substrate 101 having an indium tin oxide (ITO) anode 110 with a thickness of 800 Å was cleaned, subjected to plasma processing using UV ozone and oxygen, dried in a nitrogen-filled glovebox to remove moisture, mounted on a substrate holder, and placed in a vacuum chamber. Organic layers were sequentially deposited by vacuum thermal evaporation on the ITO anode at a rate of 0.01 Å/s to 10 Å/s and at a vacuum degree of about $10^{-6}$ Torr. First, Compound HT-18, Compound 1-2, and Compound 3-1 were co-deposited as a first organic layer 120 (that is, an HIL) (100 Å), wherein the mass ratio of Compound HT-18, Compound 1-2, and Compound 3-1 was 87.5:12:0.5. Compound HT-18 was deposited as a hole transporting layer (HTL) 130 (250 Å). Compound EB1 was deposited as an electron blocking layer (EBL) 140 (50 Å). Blue light host compound BH was doped with a blue light-emitting dopant Compound D-2 to be co-deposited as a blue emissive layer (EML) 150 (250 Å), wherein the mass ratio of Compound D-2 to Blue light host compound BH was 2:98. Compound HB was deposited as a hole blocking layer (HBL) 160 (50 Å). On the HBL, Compound ET and Liq were co-deposited as an electron transporting layer (ETL) 170 (300 Å), wherein the mass ratio of Compound ET to Liq was 40:60. The preceding layers 110 to 170 formed a first light-emitting unit 1101.

On the ETL 170, Metal Yb was deposited as an n-type material layer 210 with a thickness of 15 Å, and then Compound 1-2 was deposited as a p-type material layer 220 with a thickness of 30 Å. The charge generation layer 1102 formed by the preceding layers 210 and 220 was used to connect the first light-emitting unit 1101 and a second light-emitting unit 1103. The second light-emitting unit 1103 was deposited. Compound HT-18, Compound 1-2, and Compound 3-1 were co-deposited as a first organic layer 310 (that is, an HIL) (100 Å) in the second light-emitting unit, wherein the mass ratio of Compound HT-18, Compound 1-2, and Compound 3-1 was 87.5:12:0.5. Compound HT-18 was deposited as a hole transporting layer (HTL) 320 (400 Å). Compound EB1 was deposited as an electron blocking layer (EBL) 330 (50 Å). Blue light host compound BH was doped with a blue light-emitting dopant Compound D-2 to be co-deposited as a blue emissive layer (EML) 340 (250 Å), wherein the mass ratio of Compound D-2 to Blue light host compound BH was 2:98. Compound HB was deposited as a hole blocking layer (HBL) 350 (50 Å). On the HBL, Compound ET and Liq were co-deposited as an electron transporting layer (ETL) 360 (300 Å), wherein the mass ratio of Compound ET to Liq was 40:60.

On the ETL, Liq was deposited as an electron injection layer (EIL) 370 with a thickness of 10 Å. Finally, Al was deposited as a cathode 380 with a thickness of 1200 Å. After evaporation, the device was transferred back to the glovebox and encapsulated with a glass lid 102 to complete the device.

Detailed structures and thicknesses of part of organic layers of the devices are shown in Table 6 below. The layers using more than one material were obtained by doping different compounds at their mass ratios as recorded.

TABLE 6

Part of device structures in Example 3-1

| | First light-emitting unit | | Charge generation layer | | Second light-emitting unit | |
|---|---|---|---|---|---|---|
| | | | n-type | p-type | | |
| Device No. | First organic layer (HIL) | HTL | material layer | material layer | First organic layer (HIL) | HTL |
| Example 3-1 | HT-18:Compound 1-2:Compound 3-1 (87.5:12:0.5) (100 Å) | HT-18 (250 Å) | Yb (15 Å) | Compound 1-2 (30 Å) | HT-18:Compound 1-2:Compound 3-1 (87.5:12:0.5) (100 Å) | HT-18 (400 Å) |

The performance of the device in Example 3-1 is listed in Table 7, wherein the chromaticity coordinates (CIE), voltage, and external quantum efficiency (EQE) were measured at a current density of 10 mA/cm$^2$, and the device lifetime (LT97) was the time measured for the brightness to decay to 97% of the initial brightness at the drive of a constant current of 80 mA/cm$^2$.

TABLE 7

Device performance in Example 3-1

| | 10 mA/cm$^2$ | | | 80 mA/cm$^2$ |
|---|---|---|---|---|
| Device No. | CIE (x, y) | Voltage (V) | EQE (%) | LT97 (h) |
| Example 3-1 | (0.131, 0.077) | 8.3 | 18.5 | 38 |

In Example 3-1, two PDs were doped in the structure of the same organic layer and applied to the stacked device, that is, in the first light-emitting unit 1101, Compound HT-18 was used as the first organic material, two p-type dopants Compound 2-1 and Compound 3-1 were used as the doped material, and the three materials were co-deposited at a mass ratio of 87.5:12:0.5 as the first organic layer, that is, the HIL, of the first unit. In the second light-emitting unit 1103, Compound HT-18 was also used as the first organic material, two p-type dopants Compound 2-1 and Compound 3-1 were used as the doped material, and the three materials were co-deposited at a mass ratio of 87.5:12:0.5 as the first organic layer, that is, the HIL, of the second unit.

Table 7 shows the device performance of the stacked device. As can be seen from the results, the device in Example 3-1 obtained a low voltage of 8.3 V, a high EQE of 18.5%, and a long lifetime of 38 h. At present, a EQE of about 8.5% of the blue fluorescent emitting device generally reaches is already considered as a relatively high level in the industry. However, the EQE of the blue tandem fluorescent emitting device containing the specific first organic layer of the present disclosure reached an excellent level of 18.5%. It indicates that when the first organic layer in the hole transporting region contains two types of PD materials, the excellent comprehensive performance of the device can be obtained when the first organic layer is applied to the single-layer device, and the excellent comprehensive performance can also be obtained when the first organic layer is applied to the stacked device.

In addition, it is to be noted that the p-type charge generation layer in the tandem device may also be the first organic layer of the present application. For example, in Example 3-1 of the present application, the first organic layer may be directly used as the p-type charge generation layer. Of course, the p-type charge generation layer may contain the first organic material, the first p-type dopant and/or the second p-type dopant.

In conclusion, since two or more different p-type dopants are used in the first organic layer, the new organic electroluminescent device disclosed by the present application provides more space for adjusting the hole injection capability in a device and can better balance carriers in the device, thereby improving the comprehensive performance of the device. Compared with the device where only one p-type dopant is used in the first organic layer, the organic electroluminescent device having the first organic layer containing two different p-type dopants of the present disclosure obtains better comprehensive performance and achieves the great reduction in voltages and the significant improvement in lifetimes while maintaining a high external quantum efficiency.

It is to be understood that various embodiments described herein are merely examples and not intended to limit the scope of the present disclosure. Therefore, it is apparent to the persons skilled in the art that the present disclosure as claimed may include variations of specific embodiments and preferred embodiments described herein. Many of materials and structures described herein may be substituted with other materials and structures without departing from the spirit of the present disclosure. It is to be understood that various theories as to why the present disclosure works are not intended to be limitative.

What is claimed is:

1. An organic electroluminescent device, comprising an anode, a cathode, and a hole transporting region disposed between the anode and the cathode;

wherein the hole transporting region contains a first organic layer;

the first organic layer contains a first p-type dopant and a second p-type dopant;

the first p-type dopant is different from the second p-type dopant; and a doping ratio of the first p-type dopant in the first organic layer is a same as or different from a doping ratio of the second p-type dopant in the first organic layer.

2. The organic electroluminescent device according to claim 1, wherein a thickness of the first organic layer is not greater than 100 nm.

3. The organic electroluminescent device according to claim 1, wherein the first organic layer is in direct contact with the anode.

4. The organic electroluminescent device according to claim 1, wherein a lowest unoccupied molecular orbital (LUMO) of the first p-type dopant is different from a LUMO of the second p-type dopant.

5. The organic electroluminescent device according to claim 1, wherein the LUMO of the first p-type dopant and/or the LUMO of the second p-type dopant is less than or equal to −4.3 eV and greater than or equal to −6.0 eV.

6. The organic electroluminescent device according to claim 1, wherein the first organic layer further contains a third p-type dopant, and the third p-type dopant is different from both the first p-type dopant and the second p-type dopant.

7. The organic electroluminescent device according to claim 1, wherein the first organic layer further contains a first organic material.

8. The organic electroluminescent device according to claim 7, wherein a highest occupied molecular orbital (HOMO) of the first organic material is less than or equal to −4.5 eV and greater than or equal to −6.0 eV.

9. The organic electroluminescent device according to claim 1, further containing at least one emissive layer, wherein the at least one emissive layer is disposed between the anode and the cathode.

10. The organic electroluminescent device according to claim 9, wherein the at least one emissive layer contains a light-emitting material, and the light-emitting material is a phosphorescent material or a fluorescent material.

11. The organic electroluminescent device according to claim 9, further containing a charge generation layer, wherein the charge generation layer is disposed between the at least one emissive layer and the cathode and contains a p-type charge generation layer.

12. The organic electroluminescence device according to claim 11, wherein the first organic layer is in contact with the p-type charge generation layer of the charge generation layer.

13. The organic electroluminescent device according to claim 11, wherein the p-type charge generation layer contains said first p-type dopant or said second p-type dopant.

14. The organic electroluminescent device according to claim 11, wherein the p-type charge generation layer contains a first organic material, said first p-type dopant and/or said second p-type dopant.

15. An electronic assembly, comprising the organic electroluminescent device according to claim 1.

16. The organic electroluminescent device according to claim 1, wherein a thickness of the first organic layer is not greater than 20 nm.

17. The organic electroluminescent device according to claim 1, wherein $0.1\ eV \leq |LUMO_{first\ p\text{-}type\ dopant} - LUMO_{second\ p\text{-}type\ dopant}| \leq 0.5\ eV$.

18. The organic electroluminescent device according to claim 1, wherein the LUMO of the first p-type dopant and/or the LUMO of the second p-type dopant is less than or equal to −4.5 eV and greater than or equal to −5.5 eV.

* * * * *